(12) United States Patent
Imai

(10) Patent No.: US 9,773,763 B2
(45) Date of Patent: Sep. 26, 2017

(54) SEMICONDUCTOR DEVICE

(71) Applicant: Shinko Electric Industries Co., LTD., Nagano-Ken (JP)

(72) Inventor: Hitomi Imai, Nagano-Ken (JP)

(73) Assignee: Shinko Electric Industries Co., LTD., Nagano-Ken (JP)

(*) Notice: Subject to any disclaimer, the term of this patent is extended or adjusted under 35 U.S.C. 154(b) by 0 days.

(21) Appl. No.: 15/413,809

(22) Filed: Jan. 24, 2017

(65) Prior Publication Data
US 2017/0221867 A1    Aug. 3, 2017

(30) Foreign Application Priority Data

Jan. 28, 2016 (JP) ................. 2016-014579

(51) Int. Cl.
| H01L 23/52 | (2006.01) |
| H01L 25/10 | (2006.01) |
| H01L 23/538 | (2006.01) |
| H01L 23/498 | (2006.01) |
| H01L 23/00 | (2006.01) |

(52) U.S. Cl.
CPC ...... *H01L 25/105* (2013.01); *H01L 23/49811* (2013.01); *H01L 23/49816* (2013.01); *H01L 23/5389* (2013.01); *H01L 23/562* (2013.01); *H01L 2225/1035* (2013.01); *H01L 2225/1041* (2013.01); *H01L 2225/1058* (2013.01)

(58) Field of Classification Search
CPC ........... H01L 23/49816; H01L 23/5389; H01L 25/105; H01L 23/49811; H01L 23/562

USPC ........................................................ 257/773
See application file for complete search history.

(56) References Cited

U.S. PATENT DOCUMENTS 8,174,109 B2* 5/2012 Uchiyama ............. H01L 21/486
                                                    257/686
9,653,445 B2* 5/2017 Lin .......................... H01L 22/20

FOREIGN PATENT DOCUMENTS

| JP | 2006-210870 A | 8/2006 |
| WO | WO 2007/069606 A1 | 6/2007 |

* cited by examiner

*Primary Examiner* — Luan C Thai
(74) *Attorney, Agent, or Firm* — Wolf, Greenfield & Sacks, P.C.

(57) ABSTRACT

A semiconductor device includes a wiring substrate including an upper surface on which a component pad and a connection pad are formed, an electronic component connected to the component pad, a conductive connection member connected to the connection pad, an encapsulation resin that encapsulates the electronic component and the connection member, and a wiring unit. The wiring unit includes a first pad, which is embedded in the encapsulation resin and electrically connected to the connection member, and a second pad, which includes an external device connection surface located at a higher position than an upper surface of the encapsulation resin. At least one of the first pad and the second pad includes a side surface that is curved so that the curved side surface widens outwardly toward the upper surface of the encapsulation resin.

11 Claims, 17 Drawing Sheets

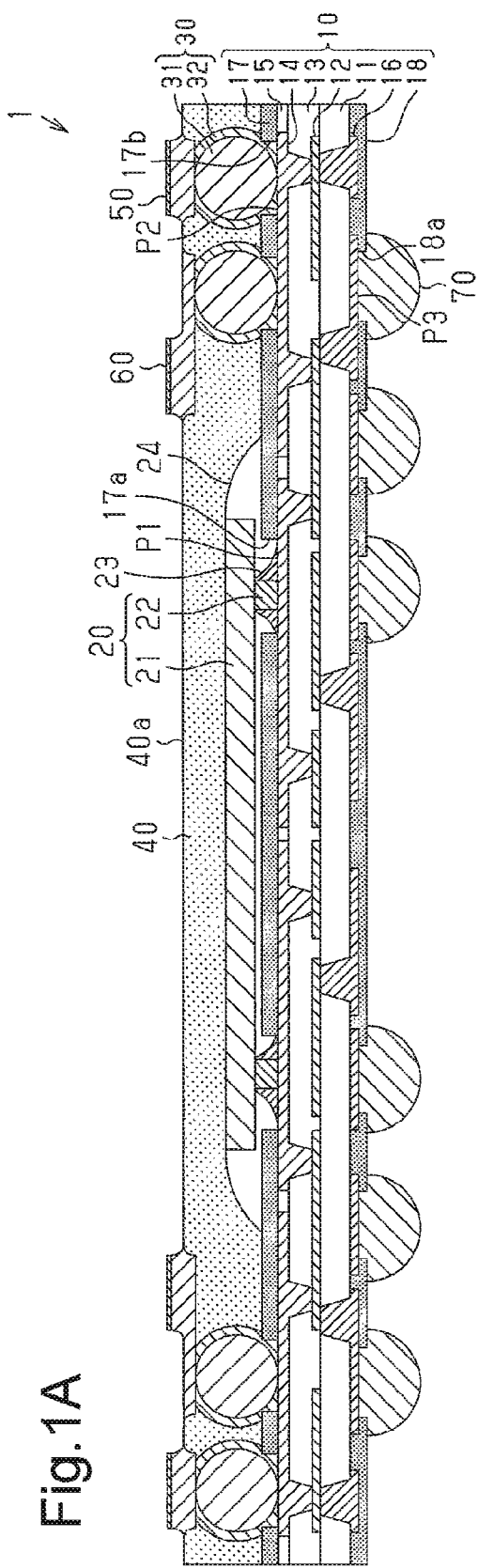
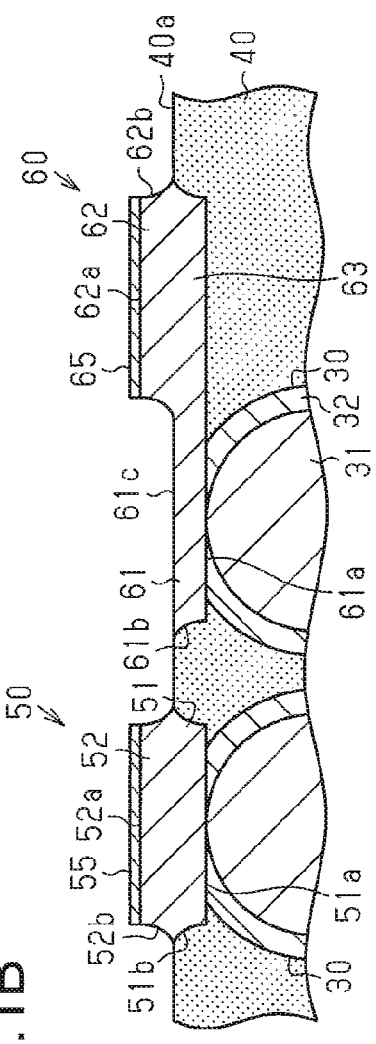
Fig.1A
Fig.1B

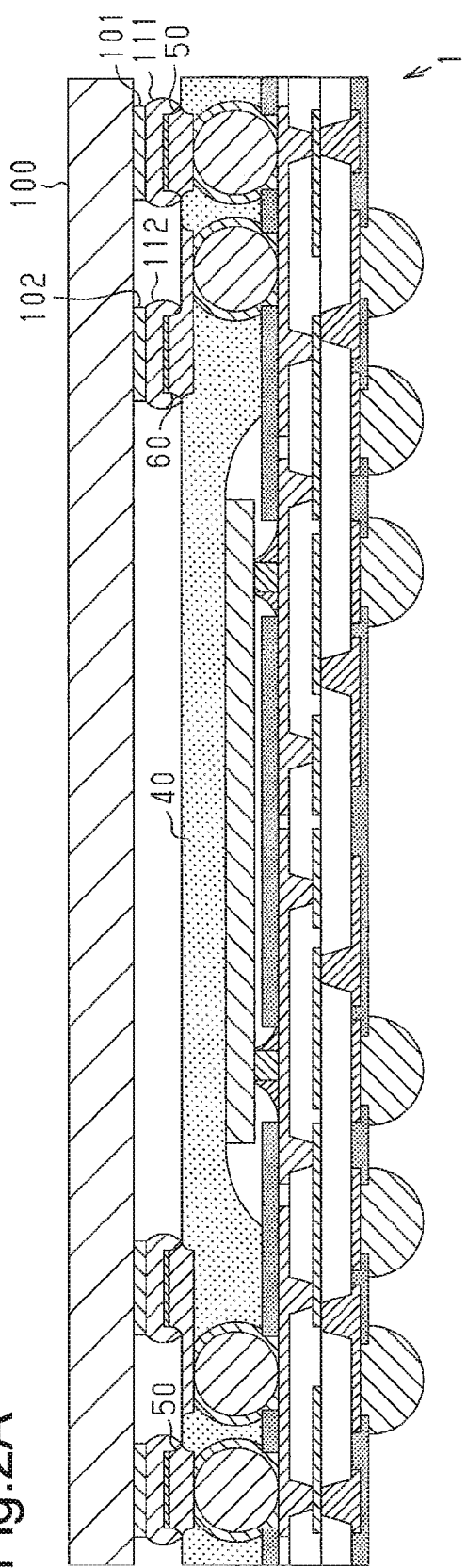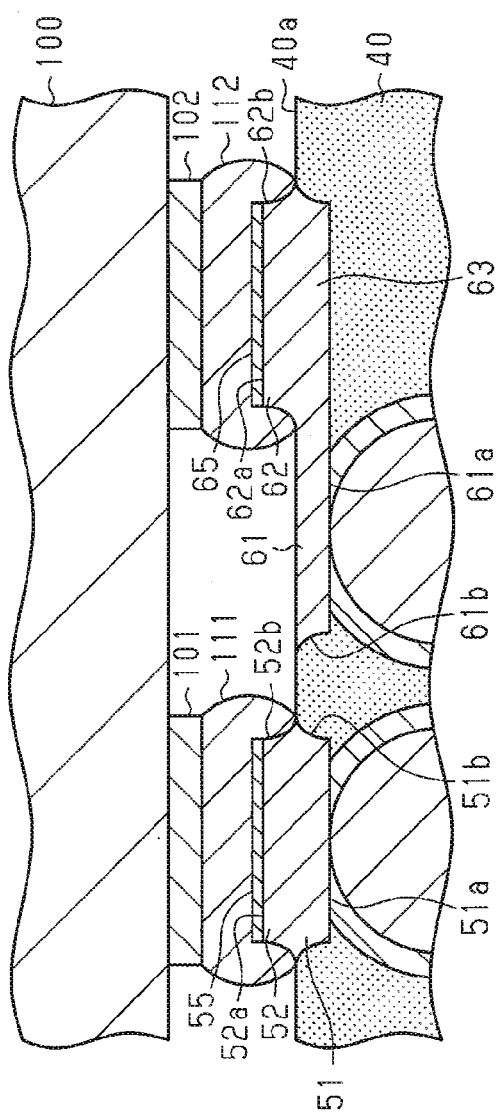

SEMICONDUCTOR DEVICE

CROSS-REFERENCE TO RELATED APPLICATIONS

This application is based upon and claims the benefit of priority from prior Japanese Patent Application No. 2016-014579, filed on Jan. 28, 2016, the entire contents of which are incorporated herein by reference.

FIELD

This disclosure relates to a semiconductor device and a method for manufacturing a semiconductor device.

BACKGROUND

Semiconductor devices including semiconductor chips need to be increased in density and reduced in size. International Patent Publication No. WO2007/069606 and Japanese Laid-Open Patent Publication No. 2006-210870 describe examples of semiconductor-chip-embedded wiring substrates that are used in semiconductor devices. Such semiconductor-chip-embedded wiring substrates are stacked to increase the density of a semiconductor device.

SUMMARY

It is desired that a semiconductor device including an electronic component such as a semiconductor chip be reduced in thickness.

One embodiment of this disclosure is a semiconductor device including a wiring substrate. The wiring substrate includes an upper surface on which a component pad and a connection pad are formed. The semiconductor device also includes an electronic component connected to the component pad and a conductive connection member connected to the connection pad. The semiconductor device also includes an encapsulation resin that encapsulates the electronic component and the connection member and covers the upper surface of the wiring substrate. The semiconductor device further includes a wiring unit. The wiring unit includes a first pad and a second pad. The first pad is embedded in the encapsulation resin and electrically connected to the connection member. The second pad includes an external device connection surface located at a higher position than an upper surface of the encapsulation resin. At least one of the first pad and the second pad includes a side surface that is curved so that the curved side surface widens outwardly toward the upper surface of the encapsulation resin.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating a first embodiment of a semiconductor device;

FIG. 1B is a partially, enlarged cross-sectional view of the semiconductor device illustrated in FIG. 1A;

FIG. 2A is a schematic cross-sectional view illustrating the semiconductor device of FIG. 1A and another semiconductor device stacked thereon;

FIG. 2B is a partially, enlarged cross-sectional view of FIG. 2A;

DESCRIPTION OF THE EMBODIMENTS

Figure 3A:
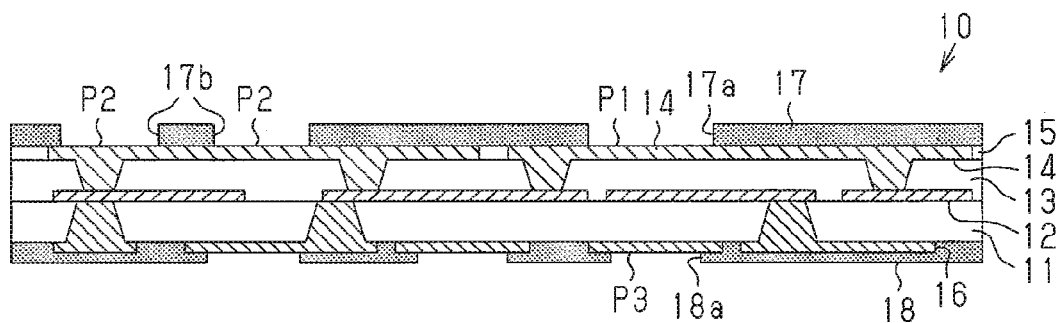
FIGS. 3A to 3C, 4A to 4C, 5A to 5E, 6A to 6C, 7A, and 7B are partial cross-sectional views illustrating a method for manufacturing the semiconductor device of FIG. 1A.

One embodiment will now be described with reference to the accompanying drawings. In the drawings, elements are illustrated for simplicity and clarity and have not necessarily been drawn to scale. To facilitate understanding, hatching lines may not be shown or be replaced by shadings in the cross-sectional drawings.

First Embodiment

As illustrated in FIG. 1A, a semiconductor device 1 includes a wiring substrate 10, a semiconductor chip 20, connection members 30, an encapsulation resin 40, wiring units 50 and 60, and the bumps 70.

The semiconductor chip 20 and the connection members 30 are mounted on an upper surface of the wiring substrate 10. The bumps 70 are formed on a lower surface of the wiring substrate 10. The semiconductor chip 20 and the connection members 30 are encapsulated in the encapsulation resin 40. The wiring units 50 and 60 are arranged on an upper surface 40a of the encapsulation resin 40. The connection members 30 electrically connect the wiring units 50 and 60 to the wiring substrate 10.

The wiring substrate 10 includes an insulation layer 11, a wiring layer 12, an insulation layer 13, a wiring layer 14, an insulation layer 15, a wiring layer 16, a protective insulation layer 17, and a solder resist layer 18.

In the wiring substrate 10, the material of the insulation layer 11 may be, for example, a glass epoxy resin obtained by impregnating a glass cloth (glass woven cloth), which is a reinforcement material, with a thermosetting insulative resin, the main component of which is an epoxy resin, and hardening the thermosetting insulative resin. The reinforcement material is not limited to glass cloth. Examples of reinforcement materials that may be used include glass non-woven cloth, aramid woven cloth, aramid non-woven cloth, liquid crystal polymer (LCP) woven cloth, or LCP non-woven cloth. The thermosetting insulative resin is not limited to an epoxy resin and may be, for example, a resin material such as a polyimide resin or a cyanate resin.

The wiring layer 12, the insulation layer 13, the wiring layer 14, and the insulation layer 15 are sequentially formed on an upper surface of the insulation layer 11. The wiring layer 16 is formed on a lower surface of the insulation layer 11. The wiring layer 12 is formed on the upper surface of the insulation layer 11. The insulation layer 13 is formed on the upper surface of the insulation layer 11 and covers the wiring layer 12. The wiring layer 14 is formed on an upper surface of the insulation layer 13. The wiring layer 14 includes a via wiring, which extends through the insulation layer 13 in a thickness-wise direction, and a wiring pattern, which is electrically connected by the via wiring to the wiring layer 12 and formed on the upper surface of the insulation layer 13. The insulation layer 15 is formed on the upper surface of the insulation layer 13. The insulation layer 15 is formed at the outer side of the wiring layer 14. In other words, the wiring layer 14 is embedded in the insulation layer 15. The wiring layer 16 includes a via wiring, which extends through the insulation layer 11 in the thickness-wise direction, and a wiring pattern, which is electrically connected by the via wiring to the wiring layer 12 and formed on the lower surface of the insulation layer 11.

The material of the insulation layers 13 and 15 may be, for example, an insulative resin, such as an epoxy resin or a polyimide resin, or a resin material obtained by mixing a filler of silica or alumina in these insulative resins. The material of the wiring layers 12, 14, and 16 may be, for example, copper (Cu) or a copper alloy.

The protective insulation layer 17 covers the insulation layer 15 and portions of the wiring layer 14. The protective insulation layer 17 includes openings 17a, from which portions in an upper surface of the wiring layer 14 are exposed as component pads P1, and openings 17b, from which portions in the upper surface of the wiring layer 14 are exposed as connection pads P2. That is, the wiring substrate 10 includes the component pads P1 and the connection pads P2 that are formed on the upper surface of the wiring layer 14. The solder resist layer 18 covers the insulation layer 11 and portions of the wiring layer 16. The solder resist layer 18 includes openings 18a from which portions in a lower surface of the wiring layer 16 are exposed as external connection pads P3.

The material of the protective insulation layer 17 may be, for example, an insulative resin such as an epoxy resin or an acrylic resin. The openings 17a and 17b in the protective insulation layer 17 have diameters set in accordance with the members that are connected to the pads P1 and P2. The material of the solder resist layer 18 may be, for example, an insulative resin such as an epoxy resin or an acrylic resin. The openings 18a in the solder resist layer 18 have diameters set in accordance with the members that are connected to the pads P3.

When necessary, a surface-processed layer may be formed on the surface of the wiring layer 14 exposed from the openings 17a and 17b. Examples of the surface-processed layer include a gold (Au) layer, a nickel (Ni) layer/Au layer (metal layer in which Ni layer is bottom layer, and Au layer is formed on Ni layer), Ni layer/palladium (Pd) layer/Au layer (metal layer in which Ni layer, Pd layer, and Au layer are stacked in this order, with Ni layer serving as the bottom layer). The Au layer, the Ni layer, and the Pd layer may be, for example, electroless plating metal layers formed through electroless plating. The Au layer is a metal layer formed from Au or a Au alloy, the Ni layer is a metal layer formed form Ni or a Ni alloy, and the Pd layer is a metal layer formed from Pd or a Pd alloy. Alternatively, the surface-processed layer may be formed by performing an anti-oxidation process such as an Organic Solderability Preservative (OSP) process on the upper surface of the wiring layer 14. When performing, for example, the OSP process, an organic coating such as that of an azole compound or an imidazole compound is formed as the surface-processed layer on the surface of the wiring layer 14 (component pads P1 and connection pads P2). The portions of the wiring layer 14 exposed by the openings 17a and 17b may be used as external connection terminals. Instead, the surface-processed layer formed on the wiring layer 14 may be used as external connection terminals. In the same manner, a surface-processed layer may be formed on portions of the wiring layer 16 exposed from the openings 18a.

The bumps 70 are formed on lower surfaces of the external connection pads P3. The bumps 70 are, for example, solder bumps serving as external connection terminals used to mount the semiconductor device 1, or the wiring substrate 10, onto other substrates (e.g., mounting substrate such as motherboard). The external connection terminals may be solder balls, lead pins, stud bumps, or the like.

The semiconductor chip 20 is mounted on the component pads P1. The semiconductor chip 20 is flip-chip-mounted on the wiring substrate 10 in a face-down state (circuit-formation surface of semiconductor chip 20 opposed to upper surface of wiring substrate 10). The semiconductor chip 20 includes a chip body 21, which is provided with a semiconductor integrated circuit, and projected electrodes 22, which serve as connection terminals. The projected electrodes 22 are electrically connected by joining members 23 to the component pads P1. The projected electrodes 22 may be, for example, gold bumps or copper posts. The joining members 23 may be formed from, for example, a solder material such as an alloy including lead (Pb), an alloy of tin (Sn) and copper (Cu), an alloy of Sn and Sb, an alloy of Sn and silver (Ag), or an alloy of Sn, Ag, and Cu.

The semiconductor chip 20 may be, for example, a logic chip such as a Central Processing Unit (CPU) chip or a Graphics Processing Unit (GPU) chip. Further, the semiconductor chip 20 may be, for example, a memory chip such as a Dynamic Random Access Memory (DRAM) chip, a Static Random Access Memory (SRAM) chip, or a flash memory chip. When multiple semiconductor chips are mounted on the wiring substrate 10, a logic chip and a memory chip may be combined.

The semiconductor chip 20 is one example of an electronic component mounted on the wiring substrate 10. The electronic component may be a passive element such as a capacitor, an inductor, or a resistor. Further, the electronic component may be a semiconductor package including a semiconductor chip such as a chip size package (CSP). A combination of a passive element and a semiconductor package may be mounted on the wiring substrate 10.

A gap between the semiconductor chip 20 and the wiring substrate 10 is filled with an underfill resin 24. The underfill resin 24 also extends along each side surface of the semiconductor chip 20. The underfill resin 24 continuously covers the circuit formation surface and side surfaces of the semiconductor chip 20. The semiconductor chip 20 includes an upper surface (surface opposite to circuit formation surface) that is exposed from the underfill resin 24. The material of the underfill resin 24 may be, for example, an insulative resin such as an epoxy resin or an acrylic resin.

The connection members 30 are connected to the connection pads P2. The connection members 30 are, for example, cored solder balls. Each connection member 30 includes a spherical core 31 and a conductive material 32, which coats the outer surface of the core 31. The cores 31 of the connection members 30 are in contact with the connection pads P2.

The core 31 may be, for example, a metal core. The material of the metal core may be, for example, copper, gold (Au), or nickel (Ni). The core 31 may also be a resin core formed from a resin. The conductive material 32 may be, for example, a solder material such as an alloy including lead (Pb), an alloy of Sn and Cu, an alloy of Sn and Sb, an alloy of Sn and Ag, or an alloy of Sn, Ag, and Cu. The core 31 has a diameter determined in accordance with the height (thickness) of the semiconductor chip 20.

In FIGS. 1A and 1B, the connection members 30 are illustrated in a simplified manner. The connection members 30 are, for example, arranged in lines along the periphery of the wiring substrate 10. When the wiring substrate 10 is rectangular in a plan view, the connection members 30 are arranged along the periphery of the wiring substrate 10.

The encapsulation resin 40 encapsulates the semiconductor chip 20, the underfill resin 24, and the connection members 30. The material of the encapsulation resin 40 may be, for example, an insulative resin such as a thermosetting epoxy resin that contains a filler.

As illustrated in FIG. 1B, the wiring units 50 and 60 are arranged on the upper surface 40a of the encapsulation resin 40. The wiring unit 50 includes a lower pad 51 and an upper pad 52. The lower pad 51 and the upper pad 52 are formed integrally with each other. The material of the wiring unit 50 may be, for example, copper or a copper alloy.

The lower pad 51 is embedded in the encapsulation resin 40. The lower pad 51 is connected to the connection members 30. The lower pad 51 includes a lower surface 51a that is in contact with the connection members 30. Accordingly, the connection members 30 electrically connect the wiring unit 50 to the connection pads P2 of the wiring substrate 10 illustrated in FIG. 1A. The lower pad 51 includes a side surface 51b that is in contact with the encapsulation resin 40.

The upper pad 52 projects from the upper surface 40a of the encapsulation resin 40. Accordingly, an upper surface 52a of the upper pad 52 is located at a higher position than the upper surface 40a of the encapsulation resin 40. A surface-processed layer 55 is formed on the upper surface 52a of the upper pad 52. The surface-processed layer 55 is, for example, a gold (Au) layer. The Au layer is a metal layer of Au or a Au alloy. Examples of the surface-processed layer 55 include a nickel (Ni) layer/Au layer (metal layer in which Ni layer is bottom layer, and Au layer is formed on Ni layer), Ni layer/palladium (Pd) layer/Au layer (metal layer in which Ni layer, Pd layer, and Au layer are stacked in this order, with Ni layer serving as the bottom layer). The Ni layer is a metal layer of Ni or a Ni alloy, and the Pd layer is a metal layer of Pd or a Pd alloy.

The side surface 51b of the lower pad 51 is curved so that the curved side surface 51b widens outwardly toward the upper surface 40a of the encapsulation resin 40. Thus, the lower pad 51 has a cross-sectional area in a plan view that increases from the lower surface 51a of the lower pad 51 toward the upper surface 40a of the encapsulation resin 40.

Further, the side surface 51b of the lower pad 51 is recessed and curved inwardly into the lower pad 51 from the lower end to the upper end (upper surface 40a of encapsulation resin 40).

In the same manner, the upper pad 52 includes a side surface 52b that is curved so that the curved side surface 52b widens outwardly toward the upper surface 40a of the encapsulation resin 40. Thus, the upper pad 52 has a cross-sectional area in a plan view that increases from the upper surface 52a of the upper pad 52 toward the upper surface 40a of the encapsulation resin 40. Further, the side surface 52b of the upper pad 52 is recessed and curved inwardly into the upper pad 52 from the upper end to the lower end (upper surface 40a of encapsulation resin 40).

The wiring unit 60 includes a lower pad 61, an upper pad 62, and a connection portion 63. The lower pad 61, the upper pad 62, and the connection portion 63 are formed integrally with one another. The material of the wiring unit 60 may be, for example, copper or a copper alloy.

The lower pad 61 is formed in the same manner as the lower pad 51 of the wiring unit 50. That is, the lower pad 61 is embedded in the encapsulation resin 40. The lower pad 61 is in contact with and connected to the connection members 30. The connection members 30 electrically connect the lower pad 61 to the connection pads P2 of the wiring substrate 10 illustrated in FIG. 1A.

The upper pad 62 is formed in the same manner as the upper pad 52 of the wiring unit 50. The upper pad 62 projects from the upper surface 40a of the encapsulation resin 40. Accordingly, the upper pad 62 includes an upper surface 62a that is located at a higher position than the upper surface 40a of the encapsulation resin 40. A surface-processed layer 65 is formed on the upper surface 62a of the upper pad 62.

In the wiring unit 60, the lower pad 61 and the upper pad 62 are located at separate positions in a plan view. The lower pad 61 is located at a position corresponding to where the connection pads P2 of the wiring substrate 10 are located. The upper pad 62 is located at a position corresponding to where the pads are located in a further semiconductor device mounted on the semiconductor device 1. The connection portion 63 serves as wiring that electrically connects the upper pad 62 and the lower pad 61. In the present embodiment, the connection portion 63 is embedded in the encapsulation resin 40 in the same manner as the lower pad 61. The connection portion 63 only needs to electrically connect the upper pad 62 and the lower pad 61 and may be partially or entirely projected from the upper surface 40a of the encapsulation resin 40.

The wiring unit 50 is applied when the connection pads P2 of the wiring substrate 10 are located at positions corresponding to where the pads of another semiconductor device are located. In this case, a portion of the lower pad 51 and a portion of the upper pad 52 function as a connection portion.

The lower pad 61 includes a side surface 61b that is curved so that the curved side surface 61b widens outwardly toward the upper surface 40a of the encapsulation resin 40. Thus, the lower pad 61 has a cross-sectional area in a plan view that increases from a lower surface 61a of the lower pad 61 toward the upper surface 40a of the encapsulation resin 40. Further, the side surface 61b of the lower pad 61 is recessed and curved inwardly into the lower pad 61 from the lower end to the upper end (upper surface 40a of encapsulation resin 40).

In the same manner, the upper pad 62 includes a side surface 62b that is curved so that the curved side surface 62b widens outwardly toward the upper surface 40a of the encapsulation resin 40. Thus, the upper pad 62 has a cross-sectional area in a plan view that increases from the upper surface 62a of the upper pad 62 toward the upper surface 40a of the encapsulation resin 40. Further, the side surface 62b of the upper pad 62 is recessed and curved inwardly into the upper pad 62 from the upper end to the lower end (upper surface 40a of encapsulation resin 40).

In the wiring units 50 and 60, the side surfaces 51b and 61b of the lower pads 51 and 61 are formed by a film of copper oxide. The copper oxide film has low solder wettability. In this manner, the side surfaces 51b and 61b of the wiring units 50 and 60 are formed by an oxide coating that lowers the solder wettability. Such an oxide film hinders the spreading of solder. In the wiring unit 60, the side surface and the lower surface of the connection portion 63 are also formed by an oxide coating such as a film of copper oxide. Further, in the wiring unit 60, an oxide film is formed in the same manner on an upper surface 61c of the lower pad 61.

In the wiring units 50 and 60, an oxide coating is not formed on the portions that contact the connection members 30. Thus, the lower surfaces 51a and 61a of the lower pads 51 and 61 in the wiring units 50 and 60 have satisfactory solder wettability and are connected to the connection members 30 in a suitable manner. A flux action, which will be described later, may be used to remove oxide coatings from the portions of the wiring units 50 and 60 that contact the connection members 30. Further, a surface-processed layer may be formed on the lower surfaces 51a and 61a. The surface-processed layer may be similar to the surface-processed layers 55 and 65. The surface-processed layer improves the solder wettability. Thus, the surface-processed layer facilitates the connection of the lower pads 51 and 61 to the connection members 30.

The operation of the semiconductor device 1 will now be described.

As illustrated in FIG. 2A, the wiring units 50 and 60 of the semiconductor device 1 are connected to another semiconductor device 100 located above the semiconductor device 1. The semiconductor device 100 is one example of an external device connected to the semiconductor device 1.

The semiconductor device 100 is, for example, a semiconductor package including semiconductor chips such as a memory or a peripheral circuit. Connection pads 101 and 102 are formed on a lower surface of the semiconductor device 100. The connection pads 101 and 102 are connected by solder 111 and 112 to the wiring units 50 and 60 of the semiconductor device 1. The solder 111 and 112 are, for example, solder bumps formed on the connection pads 101 and 102 of the semiconductor device 100. The solder bumps may be formed by, for example, mounting micro-balls on or applying solder paste to the connection pads 101 and 102 of the semiconductor device 100. Solder bumps need only be formed on at least one of the semiconductor devices 1 and 100.

As illustrated in FIG. 2B, the wiring units 50 and 60 include the lower pads 51 and 61, which are embedded in the encapsulation resin 40, and the upper pads 52 and 62, which are projected from the upper surface 40a of the encapsulation resin 40. The semiconductor device 100 is connected to the upper pads 52 and 62 of the wiring units 50 and 60. Accordingly, upper surfaces of the wiring units 50 and 60, that is, the upper surfaces 52a and 62a of the upper pads 52 and 62 function as external device connection surfaces connected to an external device. In the present example, the surface-processed layers 55 and 65 are formed on the upper surfaces 52a and 62a of the upper pads 52 and 62. Thus, upper surfaces of the surface-processed layers 55 and 65 function as external device connection surfaces. In this manner, the wiring units 50 and 60 are used to connect the semiconductor device 1 and the semiconductor device 100. This reduces the thickness of the semiconductor device 1 compared to a semiconductor device in which multiple wiring boards are stacked. Further, a Package On Package (POP) structure in which the semiconductor devices 1 and 100 are stacked may be reduced in thickness.

As illustrated in FIG. 2B, in the wiring units 50 and 60 of the semiconductor device 1, the upper pads 52 and 62 project upward from the upper surface 40a of the encapsulation resin 40. Further, as described above, the surface-processed layers 55 and 65 are formed on the upper surfaces 52a and 62a of the upper pads 52 and 62.

The solder 111 and 112 covers the upper pads 52 and 62 and surface-processed layers 55 and 65, respectively. Accordingly, the solder 111 and 112 is in contact with the surface-processed layers 55 and 65 and the side surfaces 52b and 62b of the upper pads 52 and 62. In this manner, since the upper pads 52 and 62 project from the upper surface 40a of the encapsulation resin 40, the solder 111 and 112 is applied around the side surfaces 52b and 62b of the upper pads 52 and 62. Thus, the solder 111 and 112 has a stable shape in a joined state. Consequently, the contact area is enlarged and the strength holding the solder 111 and 112 is increased as compared when the solder 111 and 112 is joined with only the upper surfaces 52a and 62a (surface-processed layers 55 and 65) of the upper pads 52 and 62.

The lower pad 51 of the wiring unit 50 is embedded in the encapsulation resin 40. In the same manner, the lower pad 61 and the connection portion 63 of the wiring unit 60 are embedded in the encapsulation resin 40. Accordingly, delamination of the wiring units 50 and 60 from the encapsulation resin 40 is limited. This obtains the required connection strength between the semiconductor device 1 and the semiconductor device 100.

The side surfaces 51b and 61b of the lower pads 51 and 61 are recessed and curved inwardly into the lower pads 51 and 61 from the lower surfaces 51a and 61a of the lower pads 51 and 61 toward the upper surface 40a of the encapsulation resin 40. Accordingly, the area of the side surfaces 51b and 61b of the lower pads 51 and 61 contacting the encapsulation resin 40 is large compared to when the side surfaces 51b and 61b are linearly formed from the lower surfaces 51a and 61a to the upper surface 40a of the encapsulation resin 40. This limits delamination of the wiring units 50 and 60 from the encapsulation resin 40 and obtains the required connection strength between the semiconductor device 1 and the semiconductor device 100.

One example of a method for manufacturing the semiconductor device 1 will now be described with reference to the drawings. The accompanying drawings illustrate a portion of the semiconductor device 1. Portions that ultimately become elements of the semiconductor device 1 are denoted by reference characters that are the same as the ultimate elements. Elements that are described below are denoted with reference characters in the drawings. Otherwise, elements may not be denoted with reference characters.

The wiring substrate 10 is prepared as illustrated in FIG. 3A. The wiring substrate 10 is manufactured through a known method. The method will now be briefly described with reference to FIG. 3A.

First, the insulation layer 11 of a glass epoxy resin or the like described above is prepared. The wiring layer 12 is formed through, for example, a semi-additive process on the upper surface of the insulation layer 11. Then, openings are formed in the insulation layer 11 through, for example, a laser cutting process, and a desmearing process is performed if necessary. The wiring layer 16 is formed on the walls of the openings of the insulation layer 11 and the lower surface of the insulation layer 11. Then, the insulation layer 13 is formed on the upper surface of the insulation layer 11 by laminating an insulative resin film of a thermosetting epoxy resin to cover the wiring layer 12. A liquid or paste of an insulative resin of a thermosetting epoxy resin or the like may be applied to the upper surface of the insulation layer 11 and hardened to form the insulation layer 13.

Then, openings are formed in the insulation layer 13 through, for example, a laser cutting process, and a desmearing process is performed if necessary. The wiring layer 14 is formed through, for example, a semi-additive process on the walls of the openings of the insulation layer 13 and the upper surface of the insulation layer 13. Then, an insulative resin film of a thermosetting epoxy resin is laminated and hardened on the upper surface of the insulation layer 13 to cover the wiring layer 14. Subsequently, for example, Chemical Mechanical Polishing (CMP) is performed until the insulative resin film is exposed from the upper surface of the wiring layer 14 to form the insulation layer 15.

Then, the protective insulation layer 17 including the openings 17a and 17b is formed on the upper surface of the wiring layer 14 and the upper surface of the insulation layer 15. Further, the solder resist layer 18 including the openings 18a is formed on the lower surface of the insulation layer 11. For example, a photosensitive resin film may be laminated onto the upper surface of the wiring layer 14 and the upper surface of the insulation layer 15. Otherwise, a liquid or paste of resin may be applied to the upper surface of the wiring layer 14 and the upper surface of the insulation layer 15. In such cases, the resin undergoes exposure and development when photolithography is performed. This patterns the resin into a given shape and obtains the protective insulation layer 17. In the same manner, for example, a photosensitive resin film may be laminated onto the lower surface of the insulation layer 11. Otherwise, a liquid or paste of resin may be applied to the lower surface of the insulation layer 11. In such cases, the resin undergoes exposure and development when photolithography is performed. This patterns the resin into a given shape and obtains the solder resist layer 18. The openings 17a and 17b in the protective insulation layer 17 expose portions of the wiring layer 14 as the component pads P1 and the connection pads P2.

Figure 3B:
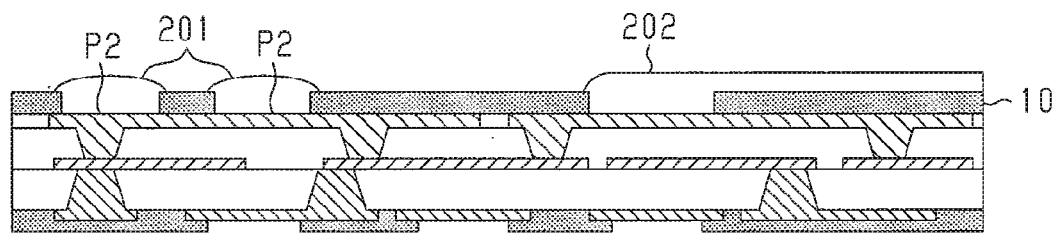

As illustrated in FIG. 3B, flux 201 is applied to the connection pads P2 of the wiring substrate 10. Further, flux 202 is applied to the region where the semiconductor chip 20 illustrated in FIG. 1A is applied. Then, referring to FIG. 3C, the connection members 30 (solder balls) are mounted on the connection pads P2. The connection members 30 undergo a reflow process at a given temperature (e.g., 240° C. to 260° C.) to fix the connection members 30 to the connection pads P2.

Figure 3C:
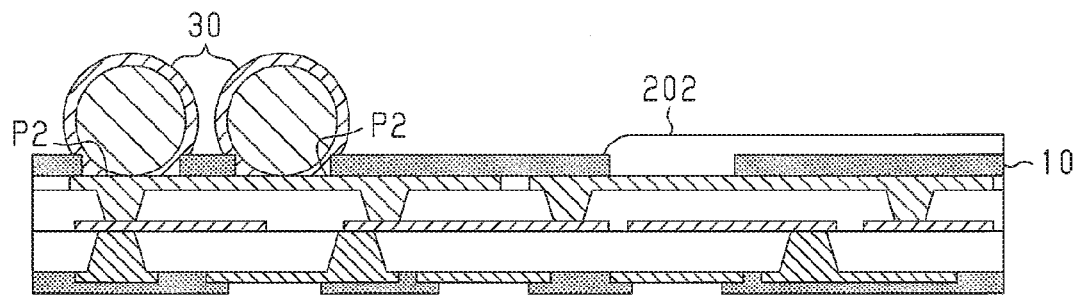
Figure 4A:
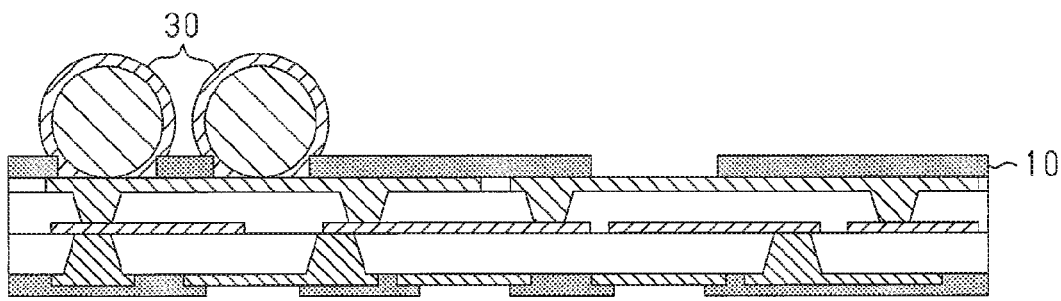

Referring to FIG. 4A, the surface of the structure illustrated in FIG. 3C is cleaned to remove the flux 202.

Figure 4B:
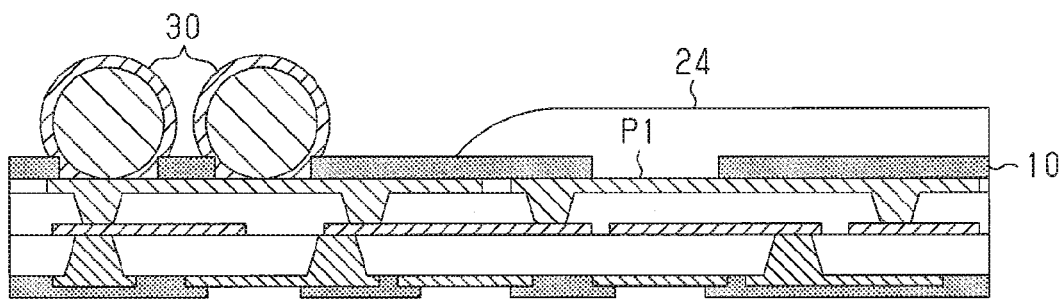

Referring to FIG. 4B, the underfill resin 24, which is in a semi-cured state (B-stage state) is formed on the region corresponding to the semiconductor chip 20 (refer to FIG. 1A). The underfill resin 24 covers the component pads P1.

Figure 4C:
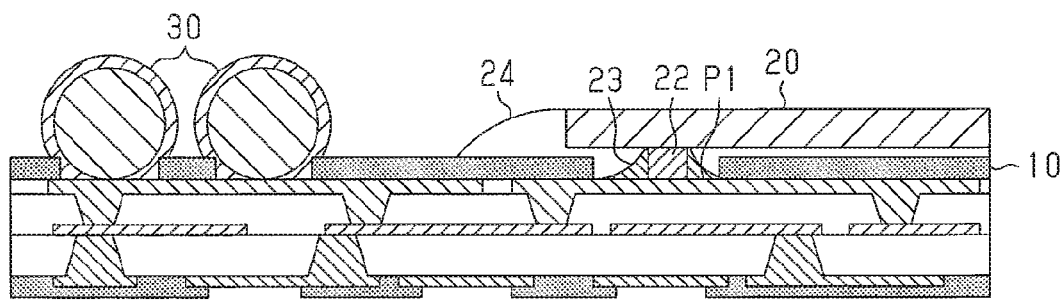

Referring to FIG. 4C, the semiconductor chip 20 is flip-chip-mounted on the wiring substrate 10. When flip-chip-mounting the semiconductor chip 20, the joining members 23 (solder) are adhered to the projected electrodes 22 of the semiconductor chip 20. Further, the semiconductor chip 20 is pressed into the underfill resin 24 so that the projected electrodes 22 contact the component pads P1. After the joining members 23 joins the projected electrodes 22 of the semiconductor chip 20 with the component pads P1, the underfill resin 24 is hardened. The joining members 23 may be solder paste that is applied to the component pads P1, and the solder paste may join the projected electrodes 22 of the semiconductor chip 20 with the component pads P1.

Figure 5A:

Referring to FIG. 5A, a metal plate 210 is prepared. The material of the metal plate 210 may be, for example, copper or a copper alloy. The metal plate 210 has a thickness of, for example, 50 to 150 µm, preferably 100 µm. For example, a plate used to form a lead frame of a semiconductor package may be used as the metal plate 210.

An etching mask 211 is formed on one surface (upper surface 210a in FIG. 5A) of the metal plate 210. The etching mask 211 is formed at a position corresponding to the portions of the wiring units 50 and 60 that are embedded in the encapsulation resin 40 of the semiconductor device 1 illustrated in FIG. 1A. The wiring unit 50 includes the lower pad 51 that is embedded in the encapsulation resin 40, and the wiring unit 60 includes the lower pad 61 and the connection portion 63 that is embedded in the encapsulation resin 40. In FIG. 5A, the etching mask 211 covers the upper surface 210a of the metal plate 210 at a position corresponding to the lower pads 51 and 61 and the connection portion 63.

The etching mask 211 is, for example, a resist layer. The material of the resist layer may be resistant to etching that is performed in the following step. For example, the resist layer may be formed by a photosensitive dry film resist or a liquid photoresist. Such a resist layer may be formed from, for example, a novolac resin or an acrylic resin. When using a photosensitive dry film resist, for example, a dry film is laminated to the upper surface 210a of the metal plate 210 through thermal compression bonding. Then, the dry film is patterned by undergoing exposure and development to form the resist layer. When using a liquid photoresist, similar steps are performed to form the resist layer. The etching mask 211 may be, for example, a plating layer formed from a single metal such as gold (Au) or a surface-processed layer formed from at least one of Au, palladium (Pd), and nickel (Ni).

Figure 5B:
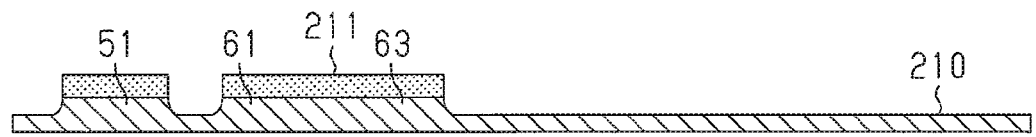

Referring to FIG. 5B, the metal plate 210 is half-etched to a given depth using the etching mask 211 to reduce the thickness of the metal plate 210. This forms the lower pads 51 and 61 and the connection portion 63 that project from the metal plate 210. Preferably, the depth of the half-etching is approximately one half of the thickness of the metal plate 210, that is, 25 to 75 µm. After the half-etching process, the etching mask 211 is removed. When using the etching mask 211 as a resist layer, the etching mask 211 is removed by performing an asking process or using an alkali delamination liquid.

Figure 5C:
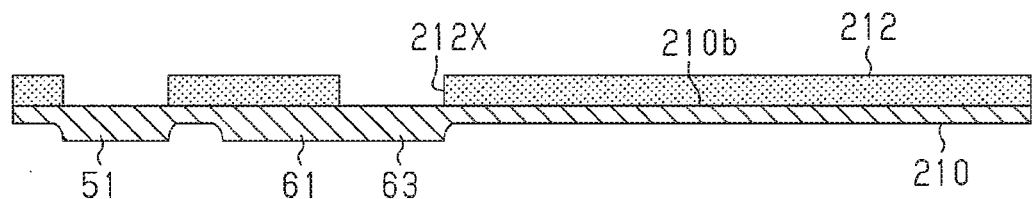

Referring to FIG. 5C, the metal plate 210, which has been thinned, includes another surface 210b. A resist layer 212 that includes openings 212X is formed at given locations on the surface 210b. In FIG. 5C, the metal plate 210, which was thinned in the step of FIG. 5B, is reversed upside down. The openings 212X expose regions corresponding to the upper pads 52 and 62 illustrated in FIG. 1A.

The material of the resist layer 212 may be resistant to etching that is performed in the following step. For example, the resist layer 212 may be formed by a photosensitive dry film resist. Such a resist material may be, for example, a novolac resin or an acrylic resin. For example, a dry film is laminated to the upper surface of the metal plate 210, which has been thinned, through thermal compression bonding. Then, photolithography is performed to pattern the dry film and form the resist layer 212 that includes the openings 212X. A liquid photoresist (e.g., liquid resist such as a novolac resin or an acrylic resin) may be used to form the resist layer 212.

Figure 5D:
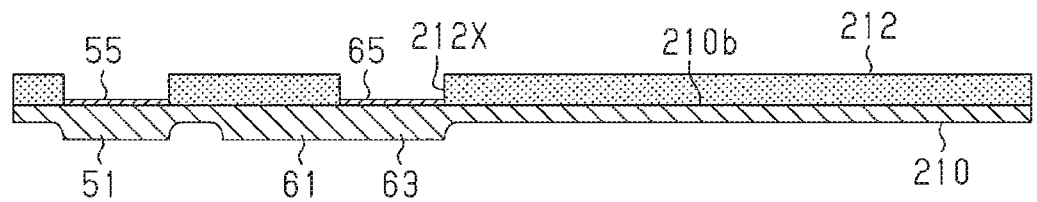

Referring to FIG. 5D, electrolytic plating is performed using the resist layer 212 as a plating mask and the metal plate 210 as a plating power supplying layer to form the surface-processed layers 55 and 65 on the upper surface 210b of the metal plate 210 that is exposed through the openings 212X. For example, when each of the surface-processed layers 55 and 65 is a Ni layer/Pd layer/Au layer, a Ni layer, a Pd layer, and an Au layer are laminated in this order on the upper surface 210b of the metal plate 210 to form the surface-processed layers 55 and 65. Then, for example, an alkali delamination liquid is used to remove the resist layer 212.

In FIG. 5D, the resist layer 212 is formed on the upper surface 210b. The lower surface of the metal plate 210 on which the lower pads 51 and 61 and the connection portion 63 are formed may be covered by a resist layer for protection from plating liquid.

Figure 5E:
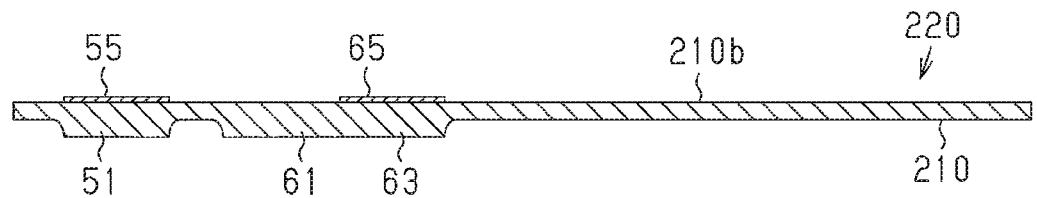

The following step is performed to obtain a structure 220 that is illustrated in FIG. 5E. The structure 220 includes the lower pads 51 and 61 and the connection portion 63 that project from the lower surface of the thinned metal plate 210 and the surface-processed layers 55 and 65 that project from the upper surface 210b.

Figure 6A:
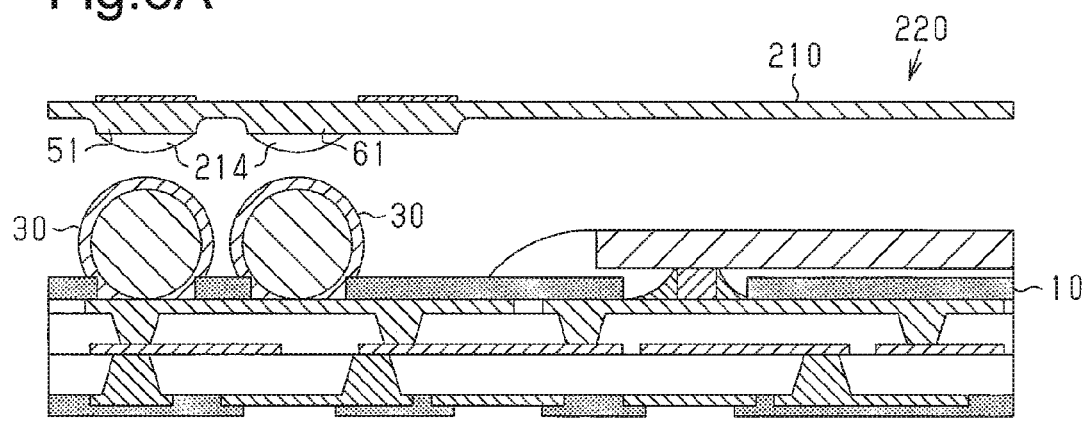

Referring to FIG. 6A, flux 214 is applied to the lower surfaces of the lower pads 51 and 61 of the structure 220. A film of copper oxide is formed on the lower surface of the structure 220. Such an oxide film is formed in, for example, the step in which the structure 220 is formed through a heat process or a heat history in various types of processes. The oxide film lowers the solder wettability. The flux 214 improves the solder wettability at the lower surfaces of the lower pads 51 and 61.

The structure 220 is arranged on the wiring substrate 10. The lower pads 51 and 61 of the structure 220 are positioned relative to the connection members 30 of the wiring substrate 10.

Figure 6B:
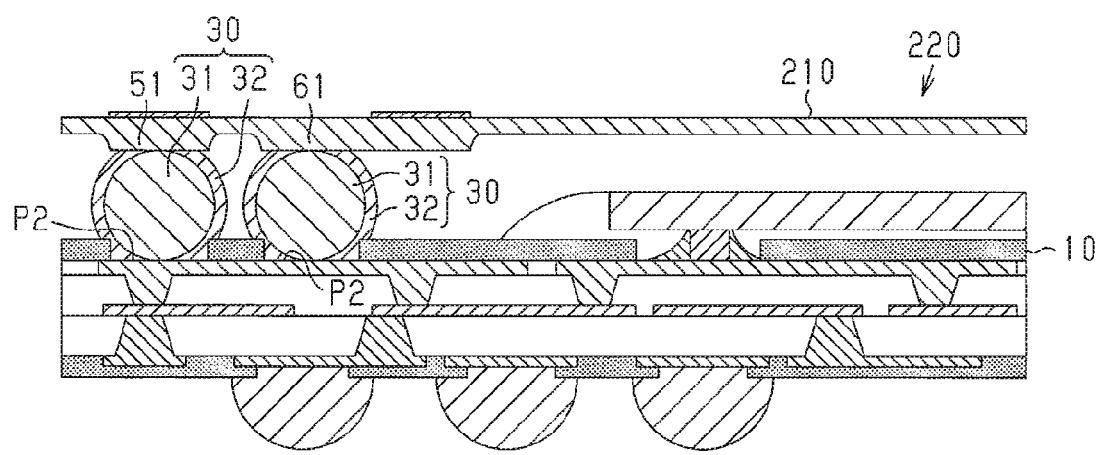

Referring to FIG. 6B, the lower pads 51 and 61 are connected to the connection members 30. For example, the structure 220 is arranged on the wiring substrate 10 and then heated in a reflow furnace to a temperature of 230° C. to 250° C. This melts the conductive material 32 on the connection members 30 and connects the connection members 30 to the lower pads 51 and 61. The core 31 of each connection member 30 functions as a spacer that keeps the structure 220 separated from the wiring substrate 10 by a given distance. In this manner, the connection members 30 electrically connect the connection pads P2 of the wiring substrate 10 to the lower pads 51 and 61 of the structure 220 in addition to fixing the structure 220 above the wiring substrate 10.

Figure 6C:
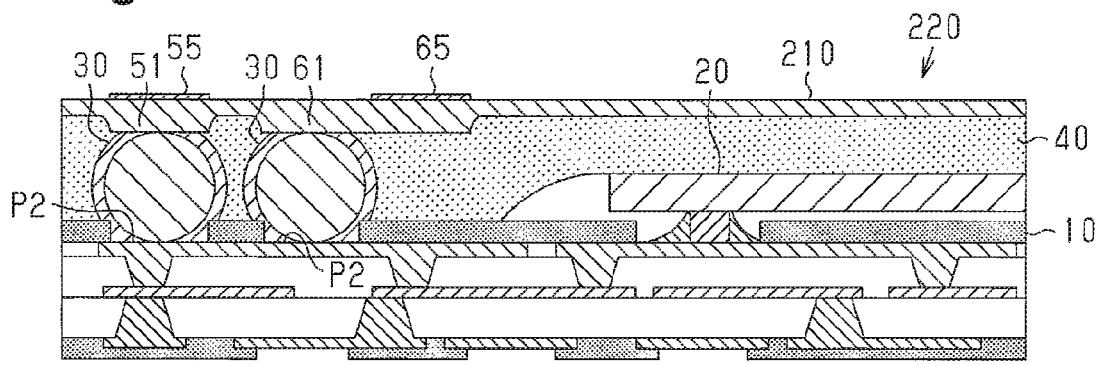

Referring to FIG. 6C, the space between the wiring substrate 10 and the structure 220 is filled with the encapsulation resin 40. The encapsulation resin 40 encapsulates the semiconductor chip 20, which is mounted on the wiring substrate 10, and the connection members 30. The encapsulation resin 40 rigidly fixes the structure 220 above the wiring substrate 10.

For example, when using a thermosetting molding resin as the material of the encapsulation resin 40, the structure of FIG. 6B is arranged in a mold, and the mold is charged with fluidized mold resin. The mold resin is heated to a given temperature (e.g., 180° C.) and hardened to form the encapsulation resin 40.

Figure 7A:
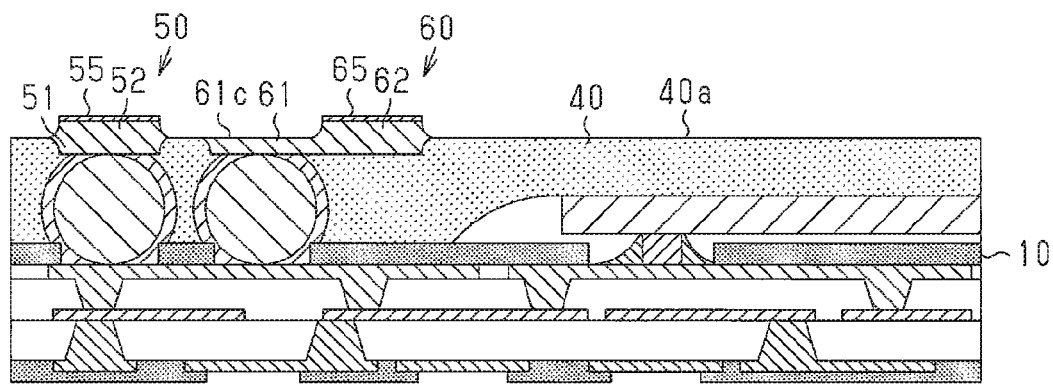

Then, the metal plate 210 of the structure 220 is etched to form the wiring units 50 and 60 illustrated in FIG. 7A. The surface-processed layers 55 and 65 are formed on the upper surface 210b of the metal plate 210. The metal plate 210 of the structure 220 is half-etched using the surface-processed layers 55 and 65 as etching masks. The half-etching forms the upper pads 52 and 62, as illustrated in FIG. 7A, and separates the wiring units 50 and 60 from each other.

In the wiring unit 60, portions of the upper pad 62 other than that covered by the surface-processed layer 65 are half-etched to form the lower pad 61 that is embedded in the encapsulation resin 40. The upper surface 61c of the lower pad 61 is substantially flush with the upper surface 40a of the encapsulation resin 40. In this manner, etching is performed to expose the upper surface 40a of the encapsulation resin 40 and separate the wiring units 50 and 60 from each other.

Figure 7B:
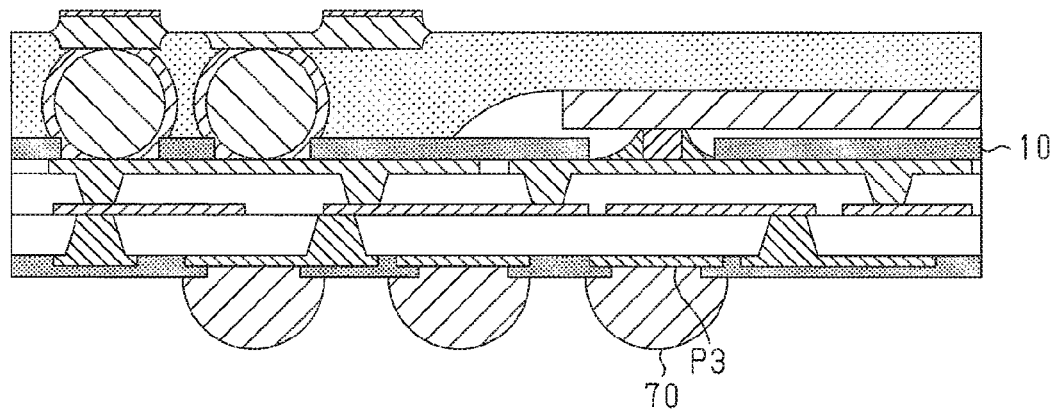

Referring to FIG. 7B, the bumps 70 are formed on the external connection pads P3 at the lower surface of the wiring substrate 10. The bumps 70 are formed through, for example, a reflow process.

The first embodiment has the advantages described below.

(1-1) The semiconductor device 1 includes the wiring substrate 10, the semiconductor chip 20, the connection members 30, the encapsulation resin 40, the wiring units 50 and 60, and the bumps 70. The component pads P1 and the connection pads P2 are formed on the upper surface of the wiring substrate 10. The semiconductor chip 20 is connected to the component pads P1. The connection members 30 are connected to the connection pads P2. The encapsulation resin 40 covers the upper surface of the wiring substrate 10 and encapsulates the semiconductor chip 20 and the connection members 30. The wiring units 50 and 60 are arranged in the upper surface 40a of the encapsulation resin 40. The wiring units 50 and 60 include the lower pads 51 and 61, which are embedded in the encapsulation resin 40, and the upper pads 52 and 62, which project from the upper surface 40a of the encapsulation resin 40. The upper pads 52 and 62 are connected to the other semiconductor device 100, which is arranged on the semiconductor device 1.

In this manner, the upper pads 52 and 62, which are connected to the semiconductor device 100, project from the upper surface 40a of the encapsulation resin 40. This reduces the thickness of the semiconductor device 1 as compared with when stacking wiring substrates and encapsulating the semiconductor chips between the wiring substrates.

(1-2) In the wiring units 50 and 60, the upper pads 52 and 62 project from the upper surface 40a of the encapsulation resin 40. Further, in the wiring units 50 and 60, the solder 111 and 112 that connects the semiconductor device 100 extends around the side surfaces 52b and 62b of the upper pads 52 and 62. This stabilizes the shape of the solder 111 and 112 in a joined state. Thus, even when the distance is small between the wiring units 50 and 60, short-circuiting is prevented between the wiring units 50 and 60.

(1-3) The side surfaces 52b and 62b of the upper pads 52 and 62 are recessed and curved inwardly into the upper pads 52 and 62. Accordingly, when the semiconductor device 100 is connected to the upper pads 52 and 62, the area of the solder 111 and 112 that is in contact with the upper pads 52 and 62 is increased. This increases the strength holding the solder 111 and 112.

(1-4) The side surfaces 51b and 61b of the lower pads 51 and 61 are recessed and curved inwardly into the lower pads 51 and 61. Accordingly, the lower pads 51 and 61 are in contact with the encapsulation resin 40 over a large area. Thus, the strength connecting the lower pads 51 and 61 with the encapsulation resin 40 is high.

Modified Example

In the above embodiment, the shapes of the wiring units 50 and 60 and the etched regions of the wiring units 50 and 60 may be changed. For example, as described below, elements other than wiring units may be embedded in the encapsulation resin 40.

FIGS. 8A to 8E are partial perspective views illustrating manufacturing steps of a semiconductor device. FIGS. 8A to 8E are schematic views illustrating how each step is processed in a simplified manner to aid understanding and may differ from actual scale and shape.

Figure 8A:
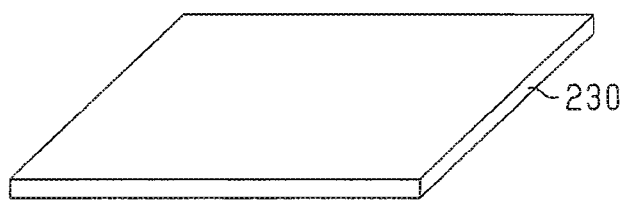
FIGS. 8A to 8E are perspective views illustrating a method for manufacturing a wiring unit.
Figure 8B:
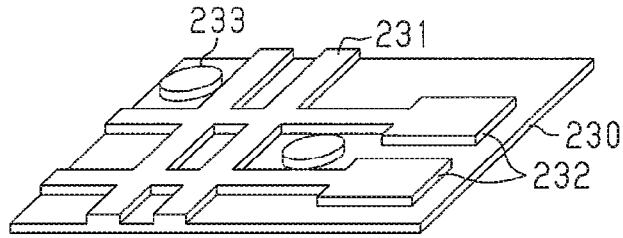

A metal plate 230 is prepared as illustrated in FIG. 8A. As illustrated in FIG. 8B, the metal plate 230 is half-etched to form wirings 231, lower pads 232, and the dummy patterns 233. In this example, the lower pads 232 each have a square shape in a plan view, and the dummy patterns 233 each have a circular shape in a plan view. The line-and-space (L/S) of the wirings 231 defined by wiring width (L)/wiring interval (S) is, for example, 50 μm/50 μm. The wiring interval is the distance between two adjacent wirings 231.

Figure 8C:
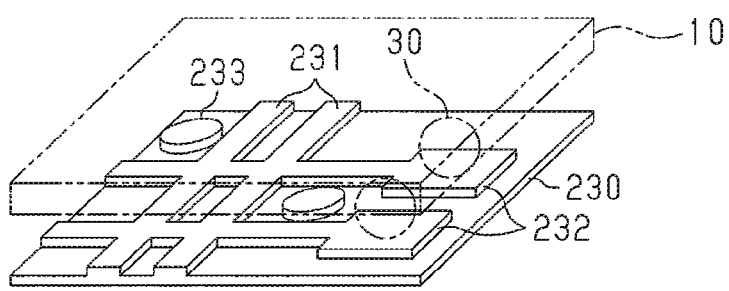
Figure 8D:
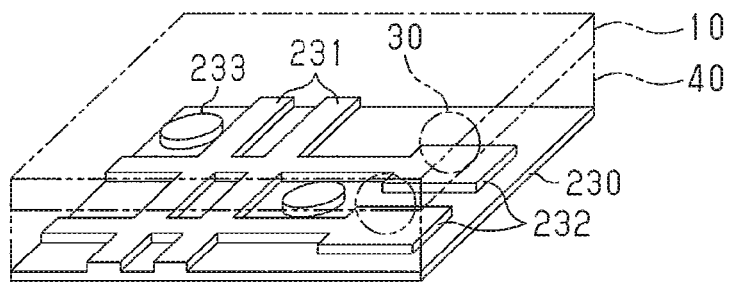

Referring to FIG. 8C, the wiring substrate 10 is positioned. The connection members 30 are mounted on the wiring substrate 10. The connection members 30 are connected to the lower pads 232. In FIGS. 8C and 8D, the wiring substrate 10 and the connection members 30 are illustrated in double-dashed lines to aid understanding of the shape of the metal plate 230.

Referring to FIG. 8D, the encapsulation resin 40 is formed between the metal plate 230 and the wiring substrate 10.

Figure 8E:
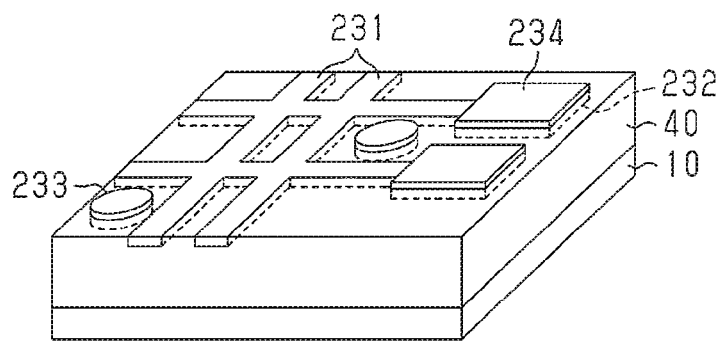

Referring to FIG. 8E, the metal plate 230 is etched so that upper pads 234 and the dummy patterns 233 project from the upper surface 40a of the encapsulation resin 40. FIG. 8E illustrates the structure of FIG. 8D reversed upside down. In this step, the portions of the metal plate 230 projecting from the upper surface 40a of the encapsulation resin 40 are etched and removed in the same manner as the step of FIG. 7A. This embeds the wirings 231 in the encapsulation resin 40 and allows the wirings 231 embedded in the encapsulation resin 40 to be fine.

In the above embodiment, the upper and lower pads may be shaped differently.

Figure 9A:
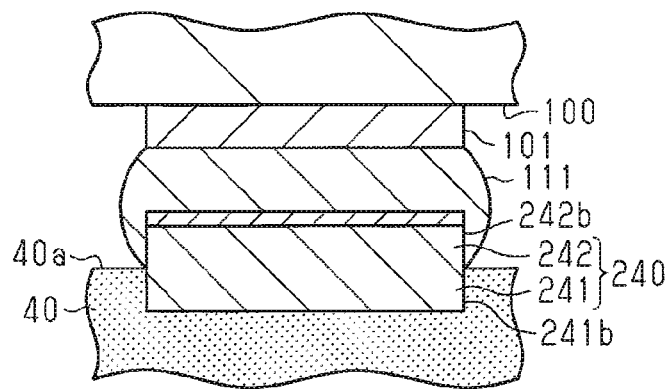
FIGS. 9A to 9C are cross-sectional views illustrating wiring units in various modified examples.

For example, referring to FIG. 9A, a side surface 241b of a lower pad 241 and a side surface 242b of an upper pad 242 may be orthogonal to the upper surface 40a of the encapsulation resin 40. Even in a wiring unit 240 having such a shape, in the same manner as the above embodiment, solder 111, which connects the semiconductor device 100, extends around the side surface 242b of the upper pad 242. This stabilizes the shape of the solder 111 in a joined state. Thus, short-circuiting is prevented between the wiring units 240 even when the distance is short between adjacent wiring units 240.

Figure 9B:
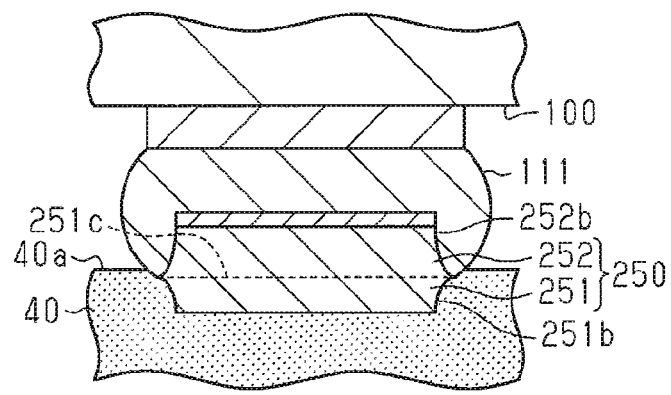

Alternatively, as illustrated in FIG. 9B, an upper surface 251c of a lower pad 251 (indicated by broken line in FIG. 9B), which is embedded in the encapsulation resin 40, may be located at a lower position than the upper surface 40a of the encapsulation resin 40. FIG. 9B illustrates a modified example of the wiring unit 50 of FIG. 1 as a wiring unit 250. The modified example may also be applied to the wiring unit 60 of FIG. 1. In this case, the upper surface 251c of the lower pad 251 embedded in the encapsulation resin 40 is located at a lower position than the upper surface 40a of the encapsulation resin 40 and exposed from the encapsulation resin 40. In the wiring unit 250 of FIG. 9B, a side surface 251b of lower pad 251 is curved so that the curved side surface 251b widens outwardly toward the upper surface 40a of the encapsulation resin 40. In the wiring unit 250, the etching time of the metal plate 210 (refer to FIG. 6C) in a step for forming an upper pad 252 is longer than the time taken to expose the upper surface 40a from the encapsulation resin 40. In the structure of FIG. 9B, a side surface 252b of the upper pad 252 exposed from the encapsulation resin 40 has a larger area than that exposed in the above embodiment. This increases the holding strength of the solder 111 that is connected to the wiring unit 250.

Figure 9C:
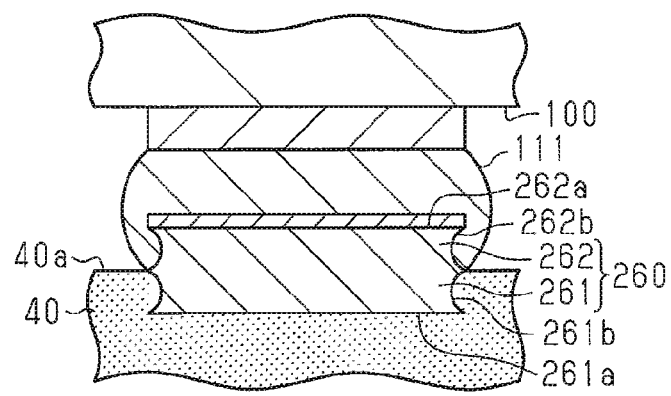

Alternatively, as illustrated in FIG. 9C, a side surface 261b of a lower pad 261 may be constricted in a recessed manner so that a middle portion in the thickness-wise direction of the lower pad 261 is located most inward. Further, a side surface 262b of an upper pad 262 may be constricted in a recessed manner so that a middle portion in the thickness-wise direction of the upper pad 262 is located most inward. In this manner, the side surface 261b of the lower pad 261 is curved further inward from an outer end (lateral end in FIG. 9C) of a lower surface 261a of the lower pad 261 to form a recess. In this structure, the encapsulation resin 40 extends into the recess defined in the side surface 261b. This increases the strength connecting the encapsulation resin 40 and a wiring unit 260. In the same manner, the side surface 262b of the upper pad 262 is curved further inward from an outer end (lateral end in FIG. 9C) of an upper surface 262a of the upper pad 262 to form a recess. Thus, the solder 111 extends into the recess defined in the side surface 262b of the upper pad 262 and increases the strength holding the solder 111.

Second Embodiment

A second embodiment will now be described. Same reference numerals are given to those components that are the same as the corresponding components of the first embodiment. Such components will not be described in detail.

Figure 10:
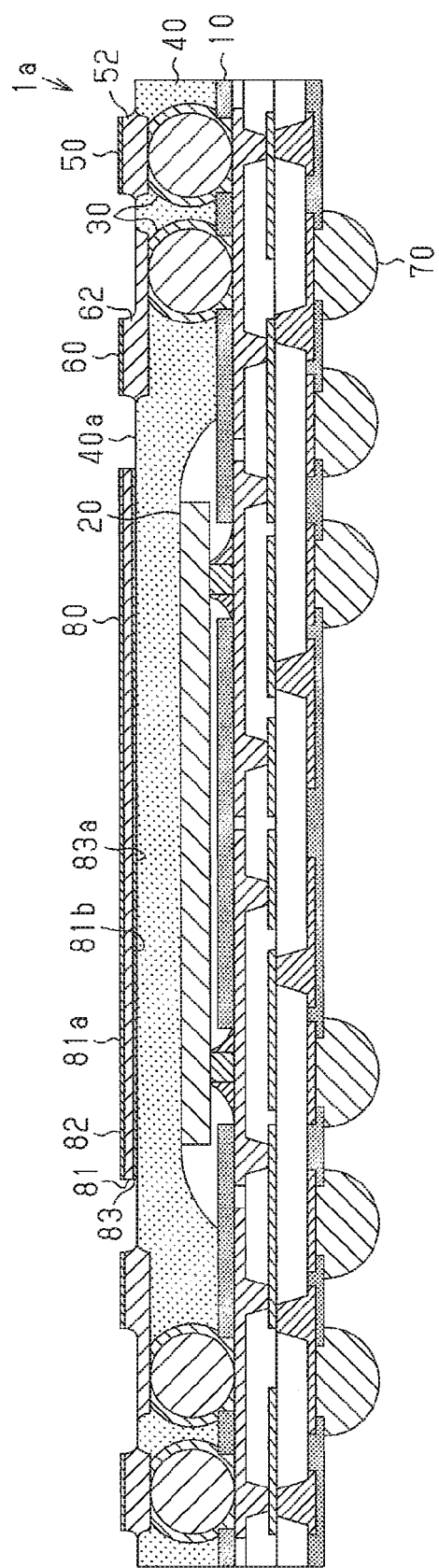
FIG. 10 is a schematic cross-sectional view illustrating a second embodiment of a semiconductor device.

Referring to FIG. 10, a semiconductor device 1a includes the wiring substrate 10, the semiconductor chip 20, the connection members 30, the encapsulation resin 40, the wiring units 50 and 60, the bumps 70, and a reinforcement plate 80.

The reinforcement plate 80 is arranged on the upper surface 40a of the encapsulation resin 40 above the semiconductor chip 20 that is encapsulated in the encapsulation resin 40.

Figure 11:
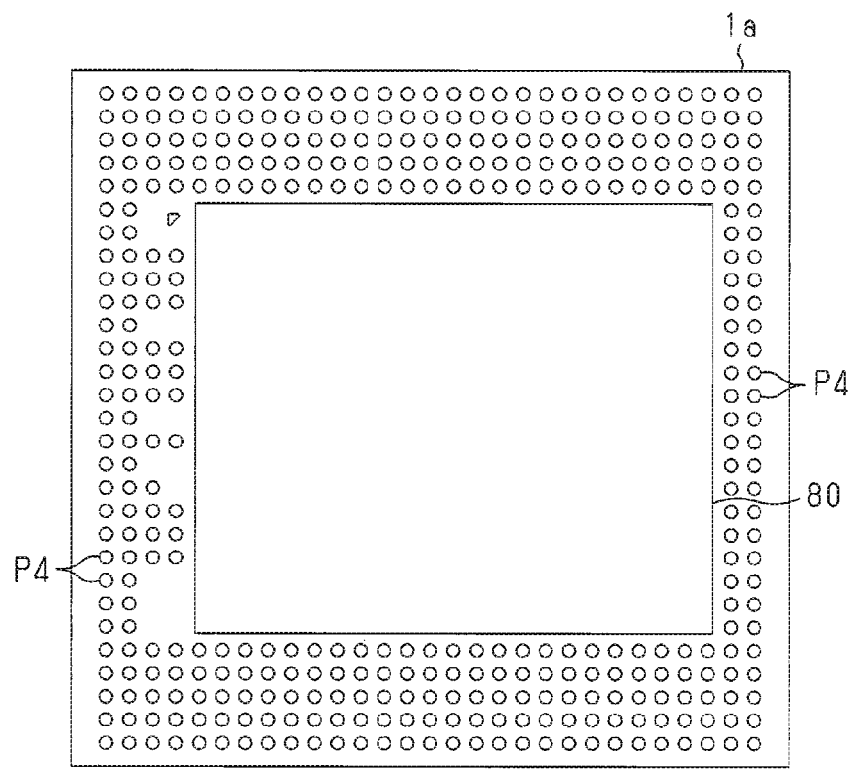
FIG. 11 is a schematic plan view of the semiconductor device illustrated in FIG. 10.

Referring to FIG. 11, the semiconductor device 1a is rectangular in a plan view. Lines of upper pads P4 are arranged along the periphery of the semiconductor device 1a. Each upper pad P4 is the upper pad 52 or the upper pad 62 illustrated in FIG. 10. The upper pads P4 illustrated in FIG. 11 differs in arrangement and number from the upper pads 52 and 62 illustrated in FIG. 10. In the semiconductor device 1a, the reinforcement plate 80 is arranged in a region located at the inner side of the upper pads P4 in a plan view. In the present embodiment, the reinforcement plate 80 is rectangular in a plan view.

Referring to FIG. 10, the reinforcement plate 80 includes a base plate 81, a surface-processed layer 82, and a rough-surface plating layer 83. The base plate 81 is a rectangular plate in a plan view. The material of the base plate 81 is copper or a copper alloy. The reinforcement plate 80 is formed by, for example, a metal plate that forms the wiring units 50 and 60.

The surface-processed layer 82 is formed on an upper surface 81a of the base plate 81. The surface-processed layer 82 is, for example, a gold (Au) layer. The Au layer is a metal layer of Au or a Au alloy. The surface-processed layer 82 may be a nickel (Ni) layer/Au layer (metal layer in which Ni layer is bottom layer, and Au layer is formed on Ni layer) or a Ni layer/palladium (Pd) layer/Au layer (metal layer in which Ni layer, Pd layer, and Au layer are stacked in this order, with Ni layer serving as the bottom layer). The Ni layer is a metal layer of Ni or a Ni alloy, and the Pd layer is a metal layer of Pd or a Pd alloy.

The rough-surface plating layer 83 is formed on a lower surface 81b of the base plate 81. The rough-surface plating layer 83 includes a lower surface 83a that is a roughened surface. The rough-surface plating layer 83 may be formed from, for example, Cu, Ni, chromium (Cr), and Fe. Alternatively, the rough-surface plating layer 83 may be formed from an alloy obtained by combining two or more of these elements or by a stacked body of two or more of these elements. The lower surface 83a (roughened surface) of the rough-surface plating layer 83 includes fine irregularities. The roughness of the lower surface 83a is set by adjusting the plating liquid composition or current density when performing electrolytic plating on the rough-surface plating layer 83.

Figure 12:
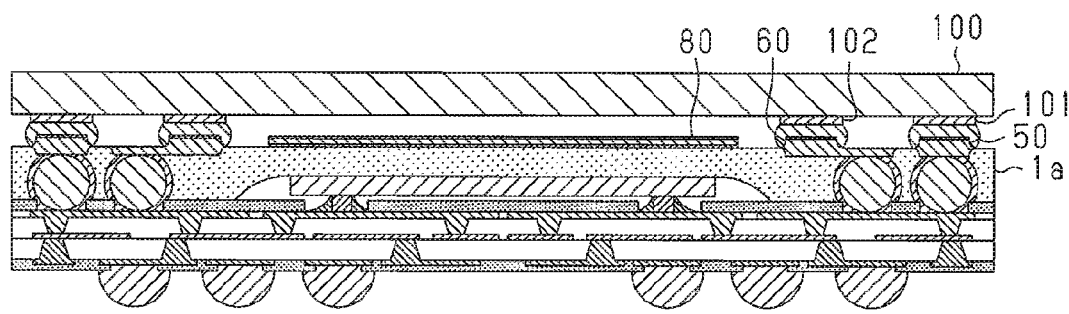
FIG. 12 is a schematic cross-sectional view illustrating the semiconductor device of FIG. 10 and another semiconductor device stacked thereon.

Referring to FIG. 12, the wiring units 50 and 60 of the semiconductor device 1a are connected to another semiconductor device 100 that is located above the semiconductor device 1a. As described above, the reinforcement plate 80 is arranged on the upper surface 40a of the encapsulation resin 40. The reinforcement plate 80 includes the base plate 81 of copper or a copper alloy. The reinforcement plate 80 limits warping of the encapsulation resin 40. Accordingly, the reinforcement plate 80 limits warping of the semiconductor device 1a or warping caused by the mounting of the other semiconductor device 100.

A method for manufacturing the semiconductor device 1a will now be described.

Figure 13A:
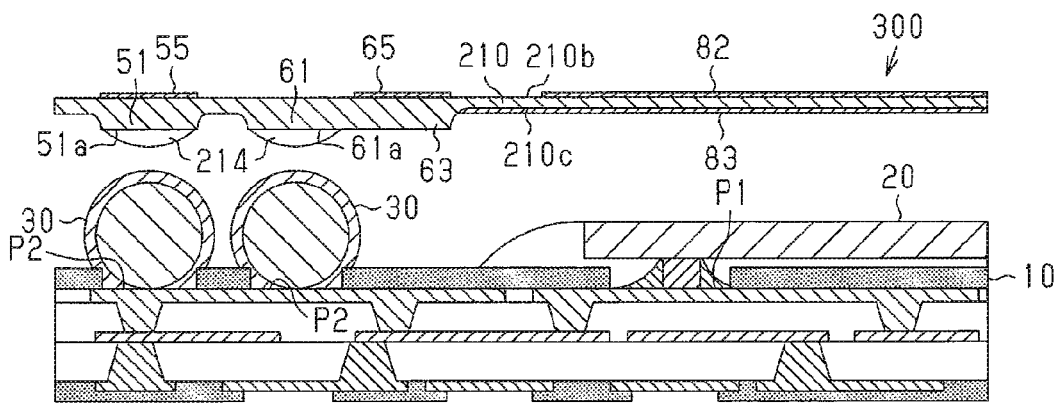
FIGS. 13A to 13C, 14A, and 14B are partial, cross-sectional views illustrating a method for manufacturing the semiconductor device of FIG. 10.

The wiring substrate 10 illustrated in FIG. 13A is formed in the same manner as the first embodiment. The semiconductor chip 20 is mounted on the component pads P1 of the wiring substrate 10. Further, the connection members 30 are connected to the connection pads P2 of the wiring substrate 10.

A structure 300 illustrated in FIG. 13A is formed in the same manner as the structure 220 (e.g., refer to FIG. 6A) of the first embodiment. In the structure 300, the lower pads 51 and 61 and the connection portion 63 are formed through the manufacturing steps of the first embodiment (FIGS. 5A to 5E). Further, the surface-processed layer 82 is formed in a region in the upper surface 210b of the metal plate 210 corresponding to the reinforcement plate 80 illustrated in FIG. 10. For example, the surface-processed layer 82 is formed on regions corresponding to the upper pads 52 and 62 illustrated in FIG. 10 at the same time as when the surface-processed layers 55 and 65 are formed. Further, the rough-surface plating layer 83 is formed on the lower surface 210c of the metal plate 210 at a location overlapped with the surface-processed layer 82 in a plan view.

For example, a resist layer including openings at locations corresponding to formation regions of the surface-processed layers 55, 65, and 82 are formed on the upper surface 210b of the metal plate 210. Electrolytic plating is performed using the metal plate 210 as a plating power supplying layer to form the surface-processed layers 55, 65, and 82 on the upper surface 210b of the metal plate 210 exposed from the openings. In the same manner, electrolytic plating is performed using the metal plate 210 as a plating power supplying layer to form the rough-surface plating layer 83 on the lower surface 210c of the metal plate 210.

Then, the flux 214 is applied to the lower surfaces 51a and 61a of the lower pads 51 and 61. A film of copper oxide is formed on portions of the lower surface of the structure 300 that are not covered by the rough-surface plating layer 83. The structure 300 is located above the wiring substrate 10. The lower pads 51 and 61 of the structure 300 are positioned on the connection members 30 mounted on the wiring substrate 10.

Figure 13B:
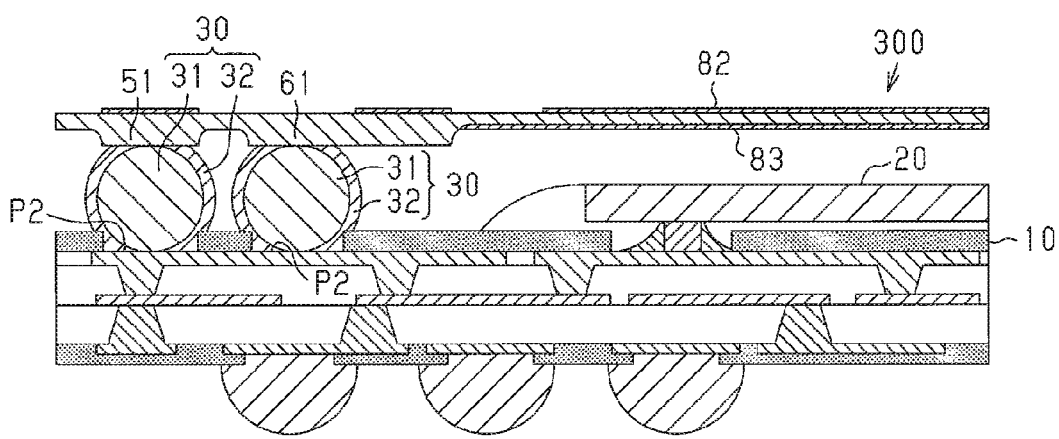

Referring to FIG. 13B, the connection members 30 are connected to the lower pads 51 and 61. For example, the structure 300 is arranged on the wiring substrate 10 and then heated in a reflow furnace to a temperature of 230° C. to 250° C. This melts the conductive material 32 of the connection members 30 and connects the connection members 30 to the lower pads 51 and 61. The core 31 of each connection member 30 functions as a spacer that holds the structure 300 at a position separated by a given distance from the wiring substrate 10. In this manner, the connection members 30 electrically connect the connection pads P2 of the wiring substrate 10 to the lower pads 51 and 61 of the structure 300 and fix the structure 300 above the wiring substrate 10.

Figure 13C:
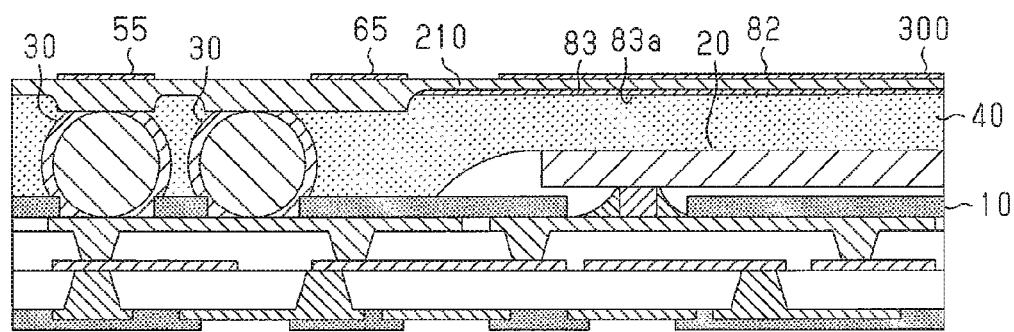

Referring to FIG. 13C, the space between the wiring substrate 10 and the structure 300 is filled with the encapsulation resin 40. The encapsulation resin 40 encapsulates the connection members 30 and the semiconductor chip 20, which are mounted on the wiring substrate 10. In the structure 300, the rough-surface plating layer 83 is formed on the lower surface of the metal plate 210. The lower surface 83a of the rough-surface plating layer 83 is a roughened surface including fine irregularities. This increases the area of contact between the rough-surface plating layer 83 and the encapsulation resin 40 as compared with when the lower surface (smooth surface) of the metal plate 210 contacts the encapsulation resin 40. Accordingly, the structure 300 is rigidly fixed to the encapsulation resin 40.

When using, for example, a thermosetting mold resin as the material of the encapsulation resin 40, the structure illustrated in FIG. 13B is arranged in a mold, and the mold is charged with fluidized mold resin. Then, the mold resin is heated to a given temperature (e.g., 180° C.) and hardened to form the encapsulation resin 40.

Figure 14A:
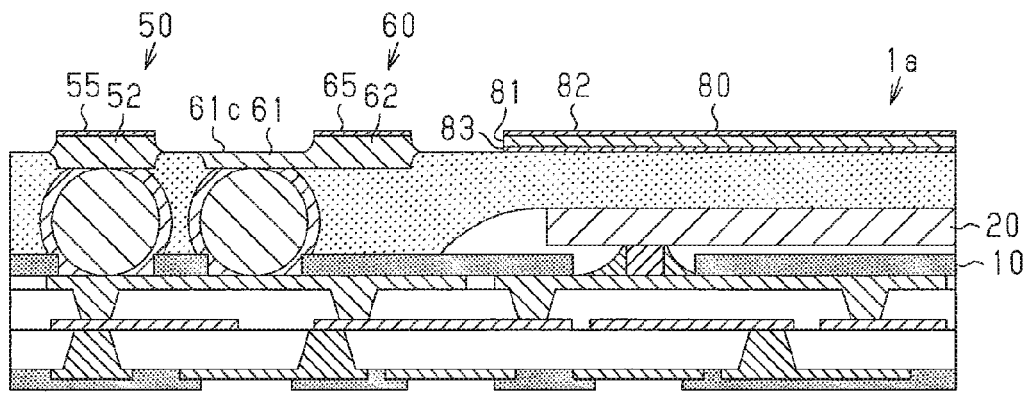

The wiring units 50 and 60 and the reinforcement plate 80 are formed as illustrated in FIG. 14A. The surface-processed layers 55, 65, and 82 are formed on the upper surface of the structure 300 illustrated in FIG. 13C. The metal plate 210 of the structure 300 is half-etched using the surface-processed layers 55, 65, and 82 as an etching mask. The etching process forms the upper pads 52 and 62 and separates the wiring unit 50, the wiring unit 60, and the reinforcement plate 80 from one another. In FIG. 14A, the side surface (left end surface in FIG. 14A) of the reinforcement plate 80 is orthogonal to the upper surface 40a of the encapsulation resin 40. However, the side surface of the reinforcement plate 80 may be curved during etching in the same manner as the side surfaces of the wiring units 50 and 60.

In the wiring unit 60, the portions of the upper pad 62 other than that covered by the surface-processed layer 65 is half-etched to form the lower pad 61, which is embedded in the encapsulation resin 40. The upper surface 61*c* of the lower pad 61 is substantially flush with the upper surface 40*a* of the encapsulation resin 40. In such a manner, etching is performed to expose the upper surface 40*a* of the encapsulation resin 40. Etching also separates the wiring unit 50, the wiring unit 60, and the reinforcement plate 80 from one another.

Figure 14B:
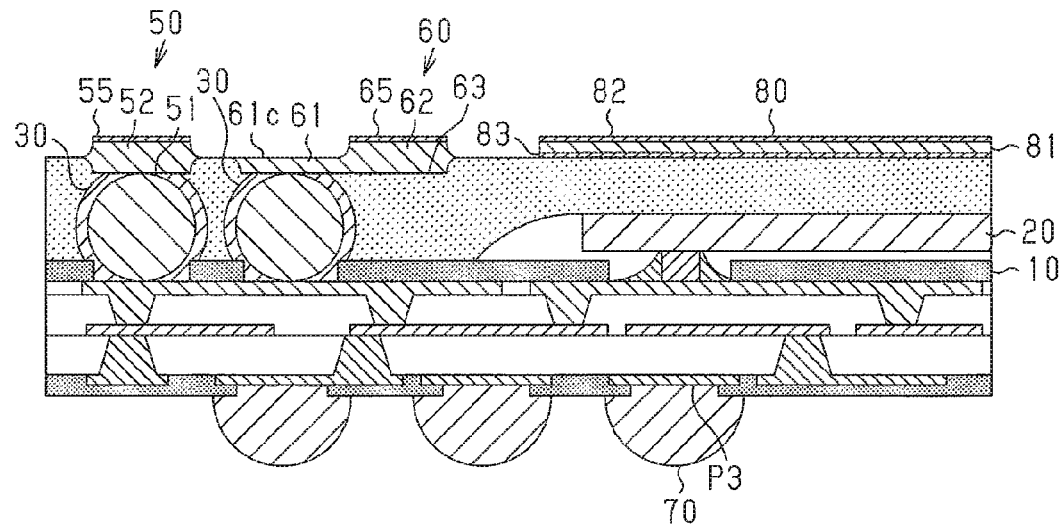

Referring to FIG. 14B, the bumps 70 are formed on the external connection pads P3, which are on the lower surface of the wiring substrate 10. The bumps 70 are formed through, for example, a reflow process.

In addition to the advantages of the first embodiment, the second embodiment has the advantages described below.

(2-1) The reinforcement plate 80 is arranged on the upper surface 40*a* of the encapsulation resin 40. The reinforcement plate 80 includes the base plate 81 of copper or a copper alloy. The reinforcement plate 80 limits warping of the encapsulation resin 40. Accordingly, the reinforcement plate 80 limits warping of the semiconductor device 1*a* and warping caused by the mounting of the other semiconductor device 100.

(2-2) The reinforcement plate 80 includes the base plate 81 and the rough-surface plating layer 83, which is formed on the lower surface 81*b* of the base plate 81. The lower surface 83*a* of the rough-surface plating layer 83 is a roughened surface including fine irregularities. This increases the area of contact between the rough-surface plating layer 83 and the encapsulation resin 40 as compared with when the encapsulation resin 40 contacts the lower surface (smooth surface) of the metal plate 210. In this manner, the lower surface of the reinforcement plate 80 (lower surface 83*a* of rough-surface plating layer 83) is a roughened surface. This obtains satisfactory adhesion between the lower surface 83*a* and the encapsulation resin 40. Accordingly, the reinforcement plate 80 is securely fixed to the encapsulation resin 40.

Modified Example

In the second embodiment, the shape and arrangement of the reinforcement plate may be changed, for example, as described below.

Figure 15A:
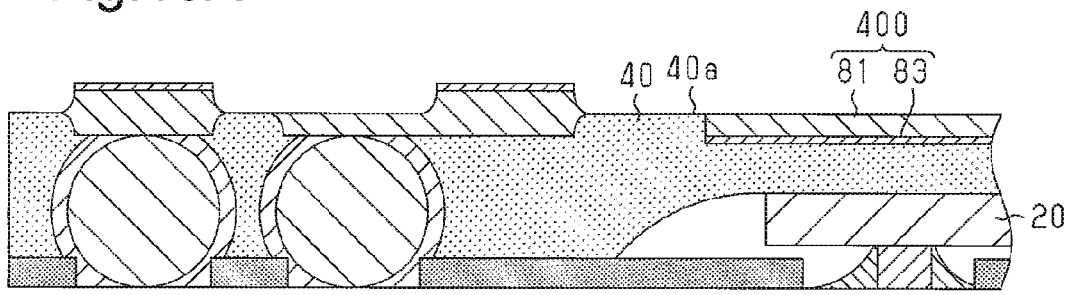
FIGS. 15A to 15D, 16A, and 16B are cross-sectional views illustrating semiconductor devices in various modified examples.

Referring to FIG. 15A, a reinforcement plate 400 may be embedded in the encapsulation resin 40. The side surfaces and lower surface of the reinforcement plate 400 is covered by the encapsulation resin 40. The reinforcement plate 400 includes the base plate 81 and the rough-surface plating layer 83, which is formed on the lower surface of the base plate 81. The reinforcement plate 400 has a thickness that is, for example, the same as that of the reinforcement plate 80 in the second embodiment.

In this manner, the reinforcement plate 400 embedded in the encapsulation resin 40 limits warping of a semiconductor device in the same manner as the reinforcement plate 80 of the second embodiment (refer to FIG. 10). Further, the reinforcement plate 400 limits warping of the semiconductor device that would be caused by a temperature change.

Figure 17A:
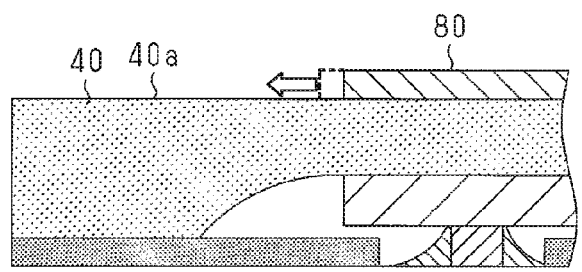
FIGS. 17A and 17B are cross-sectional views illustrating the action of a reinforcement plate.
Figure 17B:
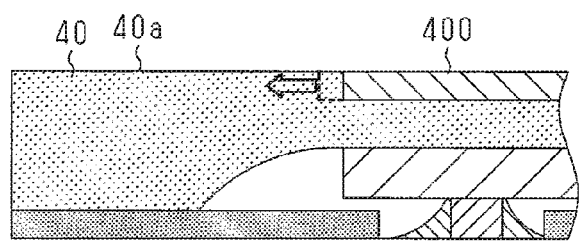

Referring to FIG. 17A, when the reinforcement plate 80 is fixed to the upper surface 40*a* of the encapsulation resin 40, a change in temperature expands or contracts the reinforcement plate 80. For example, when the reinforcement plate 80 expands as illustrated by the broken lines, the expansion force of the reinforcement plate 80 (indicated by arrow) is applied to the encapsulation resin 40 from the lower surface of the reinforcement plate 80, which is in contact with the encapsulation resin 40. However, the expansion force is not directly applied to the encapsulation resin 40 from the side surface of the reinforcement plate 80. Referring to FIG. 17B, when the reinforcement plate 400 is embedded in the encapsulation resin 40, the expansion force of the reinforcement plate 400 is directly applied to the encapsulation resin 40 from the side surface of the reinforcement plate 400. Accordingly, when a change in temperature expands the reinforcement plates 80 and 400, a difference is produced in the force applied to the encapsulation resin 40 from the reinforcement plates 80 and 400. Thus, the level of deformation of the encapsulation resin 40 and, consequently, the semiconductor device, differs in accordance with how the reinforcement plates 80 and 400 are fixed. In this manner, warping of the semiconductor device may be regulated in accordance with whether the reinforcement plate 80 is arranged on the upper surface 40*a* of the encapsulation resin 40 or whether the reinforcement plate 400 is embedded in the encapsulation resin 40.

Figure 15B:
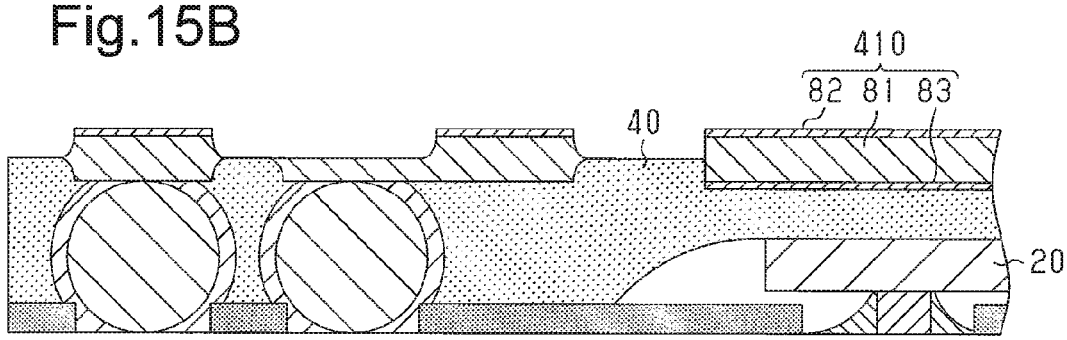

Referring to FIG. 15B, a reinforcement plate 410 may include a lower surface that is entirely embedded in the encapsulation resin 40 and a side surface that is partially embedded in the encapsulation resin 40. The reinforcement plate 410 is formed without half-etching the metal plate 210 (refer to FIG. 5A) in the region where the reinforcement plate 410 is formed. The reinforcement plate 410 includes the base plate 81, the surface-processed layer 82 formed on the upper surface of the base plate 81, and the rough-surface plating layer 83 formed on the lower surface of the base plate 81. In the reinforcement plate 410, warping of a semiconductor device is regulated by increasing the thickness of the reinforcement plate 410 and partially embedding the reinforcement plate 410 in the encapsulation resin 40.

Figure 15C:
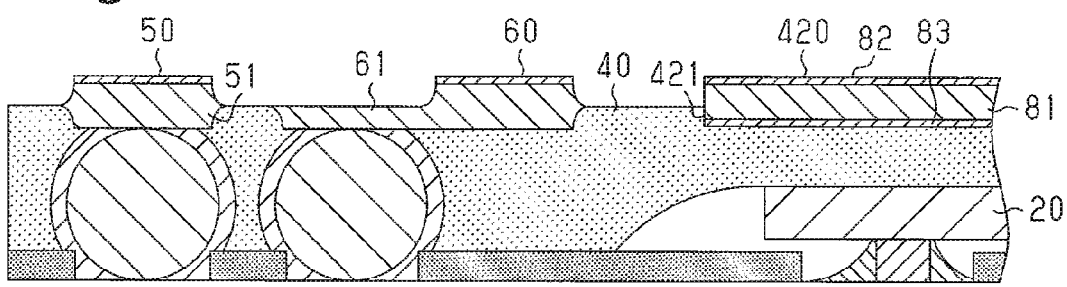

Referring to FIG. 15C, a reinforcement plate 420 may include a lower surface that is entirely embedded in the encapsulation resin 40 and a side surface that is partially embedded in the encapsulation resin 40. Further, the reinforcement plate 420 includes a portion 421 that is embedded in the encapsulation resin 40. The portion 421 may be thinner than the lower pads 51 and 61 of the wiring units 50 and 60. The reinforcement plate 420 is formed by, for example, changing the half-etching time at a certain portion. When using the reinforcement plate 420, the distance from the lower surface of the reinforcement plate 420 to the upper surface of the semiconductor chip 20 may be greater than, for example, the distance from the lower surface of the reinforcement plate 410 illustrated in FIG. 15B to the upper surface of the semiconductor chip 20. This facilitates the charging of the encapsulation resin 40 and reduces charging defects of the encapsulation resin 40.

Figure 15D:
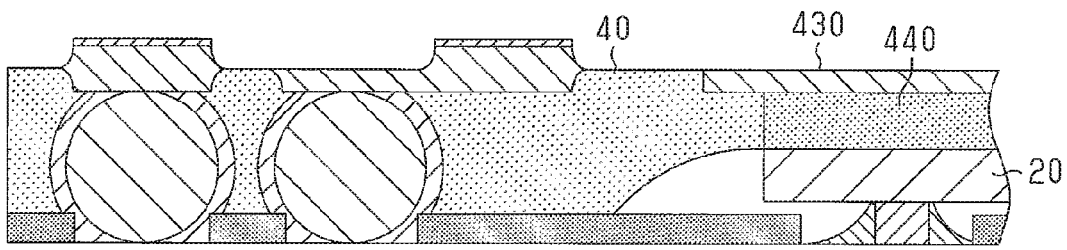

Referring to FIG. 15D, a reinforcement plate 430 may be embedded in the encapsulation resin 40, and the reinforcement plate 430 may be fixed by an adhesive agent 440 to the upper surface of the semiconductor chip 20. The adhesive agent 440 limits delamination of the reinforcement plate 430. The reinforcement plate 430 is formed by half-etching a metal plate. Since the reinforcement plate 430 is fixed to the semiconductor chip 20 by the adhesive agent 440, the reinforcement plate 430 does not include the rough-surface plating layer 83 that is illustrated in FIG. 10. Nevertheless, a rough-surface plating layer may be formed on the lower surface of the reinforcement plate 430 even when using the adhesive agent 440 to fix the reinforcement plate 430.

Figure 16A:
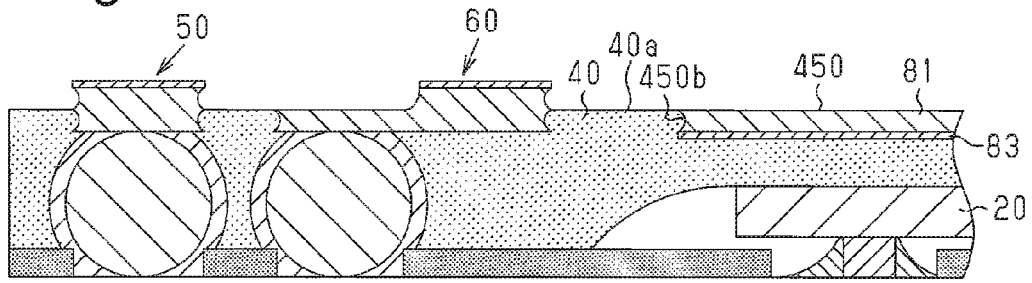

Referring to FIG. 16A, a reinforcement plate 450 may include a side surface 450*b* that is constricted in a recessed manner so that a middle portion in the thickness-wise direction of the reinforcement plate 450 is located most inward. In this case, in the same manner as the wiring units 50 and 60, the encapsulation resin 40 enters the recess defined by the side surface 450b. This limits delamination of the end (side surface 450b) of the reinforcement plate 450.

Figure 16B:
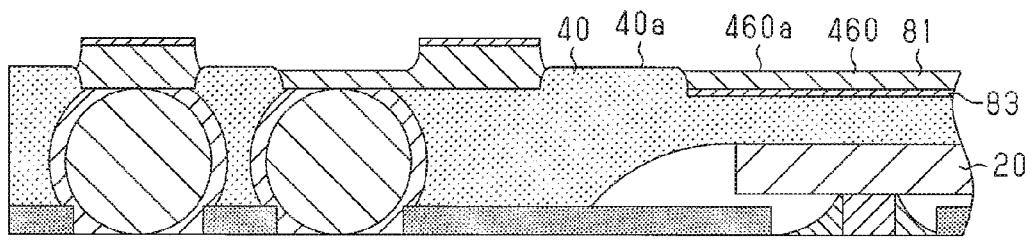

Referring to FIG. 16B, a reinforcement plate 460 may include an upper surface 460a that is located at a lower position than the upper surface 40a of the encapsulation resin 40. The reinforcement plate 460 is thinner than, for example, the reinforcement plate 400 of FIG. 15A (i.e., when upper surface of reinforcement plate 400 is flush with upper surface 40a of encapsulation resin 40). The location of the upper surface 460a of the reinforcement plate 460 may be regulated by the half-etching time or the like. The thickness of the reinforcement plate 460 affects the warping of the semiconductor device. Accordingly, the thickness of the reinforcement plate 460 regulates the warping of the semiconductor device.

Figure 18:
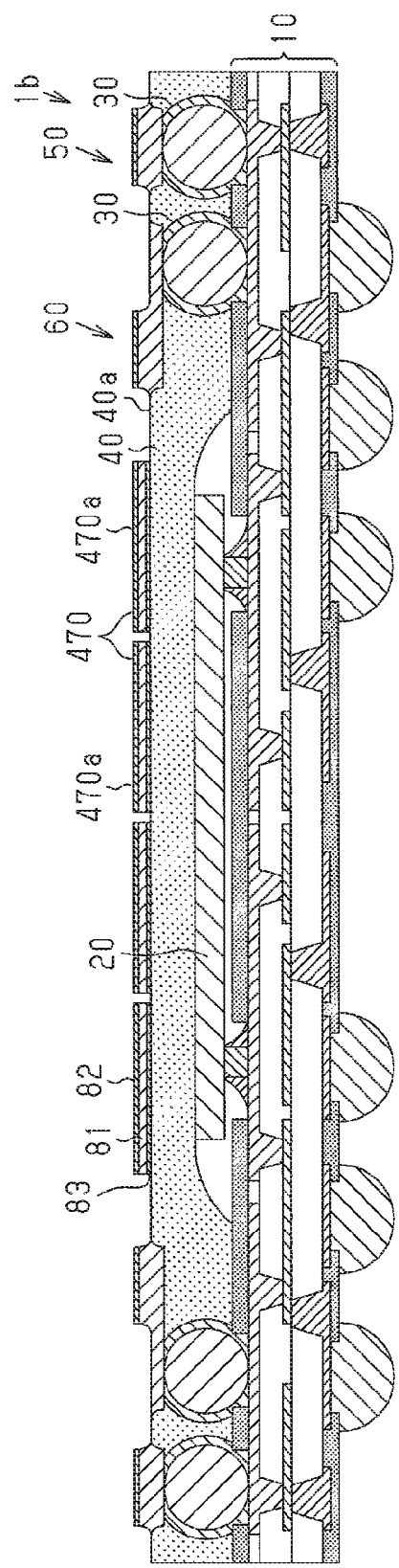
FIG. 18 is a schematic cross-sectional view illustrating a modified example of the semiconductor device.

FIG. 18 illustrates a semiconductor device 1b that includes a plurality of reinforcement plates 470 arranged on the upper surface 40a of the encapsulation resin 40. The reinforcement plates 470 may be formed by performing half-etching using a surface-processed layer 470a on the upper surface as an etching mask. The reinforcement plates 470 limit or regulate warping of the semiconductor device 1b.

Figure 19:
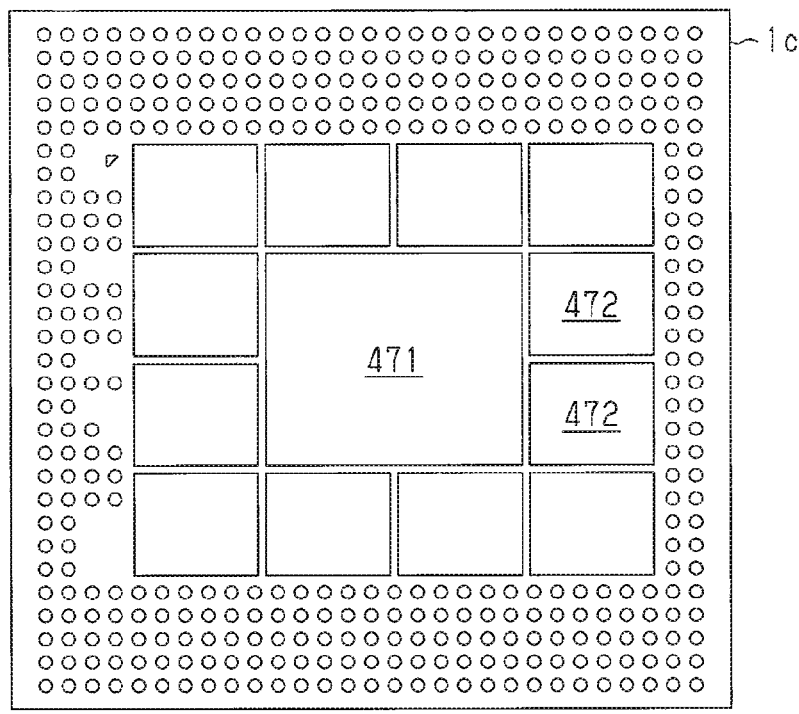
FIGS. 19 and 20 are schematic plan views illustrating semiconductor units in various modified examples.

The shape and location of the reinforcement plate may be changed. For example, referring to FIG. 19, a single reinforcement plate 471 may be arranged in the middle of a semiconductor device 1c, and reinforcement plates 472, which are smaller than the reinforcement plate 471, may be arranged around the reinforcement plate 471. In this manner, the arrangement of the reinforcement plates 471 and 472 having different sizes allows warping of the semiconductor device 1c to be regulated. The reinforcement plates 472 may be arranged in two or more lines around the reinforcement plate 471.

Figure 20:
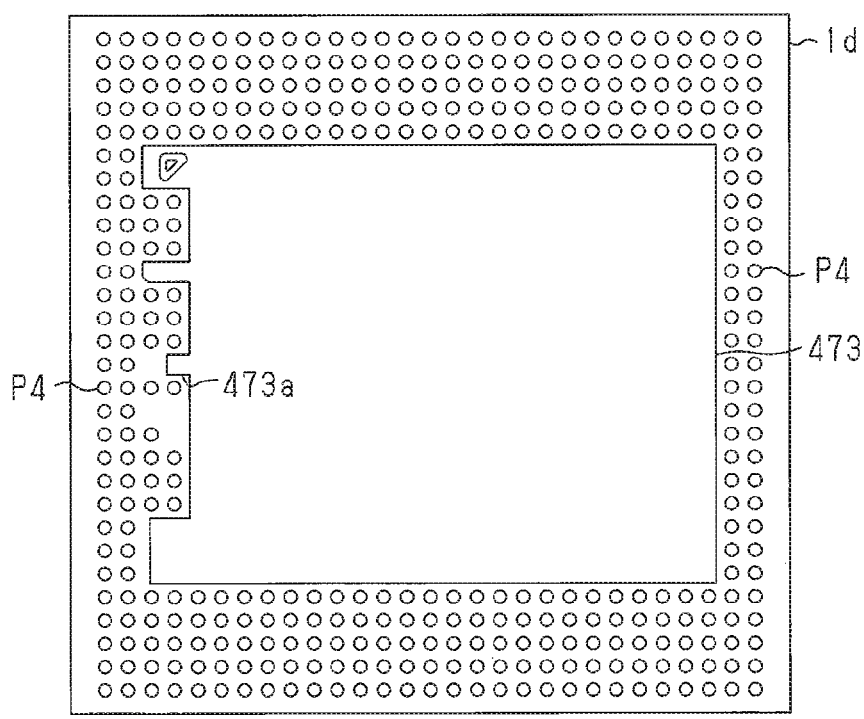

Referring to FIG. 20, a single reinforcement plate 473, which is shaped to include recesses and projections in a plan view, may be arranged on the upper surface of a semiconductor device 1d (upper surface 40a of encapsulation resin 40). The upper pads P4 are arranged on the upper surface of the semiconductor device 1d. The reinforcement plate 473 includes projections 473a that cover regions free from the upper pads P4. The reinforcement plate 473 regulates warping of the semiconductor device 1d in the same manner as the reinforcement plates described above.

It should be apparent to those skilled in the art that the foregoing embodiments may be employed in many other specific forms without departing from the scope of this disclosure. Particularly, it should be understood that the foregoing embodiments may be employed in the following forms.

In each of the above embodiments and modified examples, electronic components may be mounted on the upper surface of the wiring substrate. Further, one or more electronic components may be mounted on the lower surface of the wiring substrate 10.

In each of the above embodiments and modified examples, the insulation layer 15 illustrated in FIG. 1A may be omitted. Further, the outer region of the wiring layer 14, that is, the gaps between the wiring patterns of the wiring layer 14 may be embedded with the protective insulation layer 17.

In each of the above embodiments and modified examples, the protective insulation layer 17 may be a solder resist layer.

In each of the above embodiments and modified examples, the structure (number of wiring layers and number of insulation layers) of the wiring substrate 10 may be changed.

CLAUSES

This disclosure further encompasses the following embodiments.

1. A method for manufacturing a semiconductor device, the method including:
   forming, on an upper surface of a wiring substrate, a connection pad and a component pad;
   connecting a connection member to the connection pad;
   mounting an electronic component on the component pad;
   etching a metal plate to reduce the metal plate in thickness and form a first pad that projects from one surface of the thinned metal plate;
   arranging the thinned metal plate above the wiring substrate so that the first pad is connected to the connection member;
   forming an encapsulation resin between the wiring substrate and the thinned metal plate to encapsulate the electronic component and the connection member in the encapsulation resin and embed the first pad in the encapsulation resin; and
   etching the thinned metal plate to expose a portion of an upper surface of the encapsulation resin and form a second pad that projects from the upper surface of the encapsulation resin.

2. The method according to clause 2, wherein:
   the etching a metal plate to reduce the metal plate in thickness includes forming a connection portion that is projected from one surface of the thinned metal plate and connected to the first pad; and
   the etching the thinned metal plate includes forming the second pad that is connected to the first pad by the connection portion.

3. The method according to clause 1 or 2, wherein:
   the etching the thinned metal plate includes forming a reinforcement plate that is located above the electronic component and arranged on the upper surface of the encapsulation resin.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device comprising:
   a wiring substrate including an upper surface on which a component pad and a connection pad are formed;
   an electronic component connected to the component pad;
   a conductive connection member connected to the connection pad;
   an encapsulation resin that encapsulates the electronic component and the connection member and covers the upper surface of the wiring substrate; and
   a wiring unit that includes a first pad and a second pad, wherein the first pad is embedded in the encapsulation resin and electrically connected to the connection member, and the second pad includes an external device connection surface located at a higher position than an upper surface of the encapsulation resin,
wherein at least one of the first pad and the second pad includes a side surface that is curved so that the curved side surface widens outwardly toward the upper surface of the encapsulation resin.

2. The semiconductor device according to claim 1, wherein the wiring unit further includes a connection portion that electrically connects the first pad and the second pad.

3. The semiconductor device according to claim 2, wherein the connection portion is embedded in the encapsulation resin.

4. The semiconductor device according to claim 1, wherein the curved side surface of the second pad includes a lower end located at a lower position than the upper surface of the encapsulation resin.

5. The semiconductor device according to claim 1, wherein the curved side surface is constricted in a recessed manner so that a middle portion of the curved side surface in a thickness-wise direction is located most inward.

6. The semiconductor device according to claim 1, wherein
the first pad is formed from copper or a copper alloy, and
the curved side surface of the first pad is formed by a film of oxide copper.

7. The semiconductor device according to claim 1, further comprising a reinforcement plate located above the electronic component and arranged on the upper surface of the encapsulation resin.

8. The semiconductor device according to claim 7, wherein the reinforcement plate is one of a plurality of reinforcement plates arranged on the upper surface of the encapsulation resin.

9. The semiconductor device according to claim 7, wherein the reinforcement plate is at least partially embedded in the encapsulation resin.

10. The semiconductor device according to claim 7, wherein the reinforcement plate includes a lower surface formed by a rough-surface plating layer.

11. The semiconductor device according to claim 1, further comprising an external device connected to the external device connection surface.

* * * * *